United States Patent
Matsuo

(10) Patent No.: US 7,767,535 B2
(45) Date of Patent: Aug. 3, 2010

(54) SEMICONDUCTOR DEVICE AND METHOD OF MANUFACTURING THE SAME

(75) Inventor: Kouji Matsuo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 613 days.

(21) Appl. No.: 11/256,093

(22) Filed: Oct. 24, 2005

(65) Prior Publication Data

US 2006/0038241 A1    Feb. 23, 2006

Related U.S. Application Data

(62) Division of application No. 10/660,559, filed on Sep. 12, 2003, now Pat. No. 6,977,415.

(30) Foreign Application Priority Data

Sep. 12, 2002  (JP) .............................. 2002-266759
Sep. 10, 2003  (JP) .............................. 2003-318143

(51) Int. Cl.
*H01L 21/336* (2006.01)

(52) U.S. Cl. ........................ 438/306; 438/585; 438/595; 257/E21.437; 257/E21.444

(58) Field of Classification Search ................. 438/305, 438/306, 585, 595, FOR. 193; 257/E21.437, 257/E21.444
See application file for complete search history.

(56) References Cited

U.S. PATENT DOCUMENTS

| | | | |
|---|---|---|---|
| 5,448,094 A | 9/1995 | Hsu | |
| 5,712,503 A * | 1/1998 | Kim et al. | 257/345 |
| 5,918,134 A | 6/1999 | Gardner et al. | |
| 6,225,173 B1 * | 5/2001 | Yu | 438/301 |
| 6,376,888 B1 | 4/2002 | Tsunashima et al. | |
| 6,452,229 B1 * | 9/2002 | Krivokapic | 257/330 |
| 6,509,234 B1 * | 1/2003 | Krivokapic | 438/270 |
| 6,660,598 B2 * | 12/2003 | Hanafi et al. | 438/291 |
| 6,664,592 B2 * | 12/2003 | Inumiya et al. | 257/330 |
| 6,716,046 B2 * | 4/2004 | Mistry | 439/270 |
| 6,815,297 B1 * | 11/2004 | Krivokapic et al. | 438/287 |
| 6,841,831 B2 * | 1/2005 | Hanafi et al. | 257/369 |
| 7,091,069 B2 * | 8/2006 | Doris et al. | 438/149 |

(Continued)

FOREIGN PATENT DOCUMENTS

JP    57-087151    5/1982

(Continued)

OTHER PUBLICATIONS

Matsuo, K., "Semiconductor Device and Method of Manufacturing the Same", U.S. Appl. No. 10/396,453, filed Mar. 26, 2003.

*Primary Examiner*—George Fourson
(74) *Attorney, Agent, or Firm*—Finnegan, Henderson, Farabow, Garrett & Dunner, L.L.P.

(57) ABSTRACT

A semiconductor device comprising a semiconductor substrate having a recess whose depth is not more than 6 nm, a source region and a drain region which are formed in a surface region of the semiconductor substrate so as to sandwich the recess, each of the source region and the drain region being constituted of an extension region and a contact junction region, a gate insulating film formed between the source region and the drain region in the semiconductor substrate, and a gate electrode formed on the gate insulating film.

8 Claims, 24 Drawing Sheets

U.S. PATENT DOCUMENTS

| | | |
|---|---|---|
| 2001/0033000 A1* | 10/2001 | Mistry .................. 257/339 |
| 2001/0045597 A1* | 11/2001 | Nishinohara .............. 257/329 |
| 2002/0119607 A1* | 8/2002 | Miyasaka et al. .......... 438/151 |
| 2003/0143825 A1 | 7/2003 | Matsuo et al. |
| 2003/0211681 A1* | 11/2003 | Hanafi et al. ............. 438/200 |
| 2004/0124492 A1* | 7/2004 | Matsuo .................. 257/506 |
| 2006/0001095 A1* | 1/2006 | Doris et al. .............. 257/348 |
| 2006/0033158 A1* | 2/2006 | Diaz et al. ............... 257/344 |
| 2006/0038241 A1* | 2/2006 | Matsuo .................. 257/401 |
| 2007/0108514 A1* | 5/2007 | Inoue et al. .............. 257/330 |

FOREIGN PATENT DOCUMENTS

| | | |
|---|---|---|
| JP | 05-082547 | 4/1993 |
| JP | 09-321151 | 12/1997 |
| JP | 11-251454 | 9/1999 |
| JP | 2000-188394 | 7/2000 |
| JP | 2000-195966 | 7/2000 |
| JP | 2001-168092 | 6/2001 |
| JP | 2002-083956 | 3/2002 |
| JP | 2000-151428 | 5/2002 |
| JP | 2002-270797 | 9/2002 |
| JP | 2002-530864 | 9/2002 |

* cited by examiner

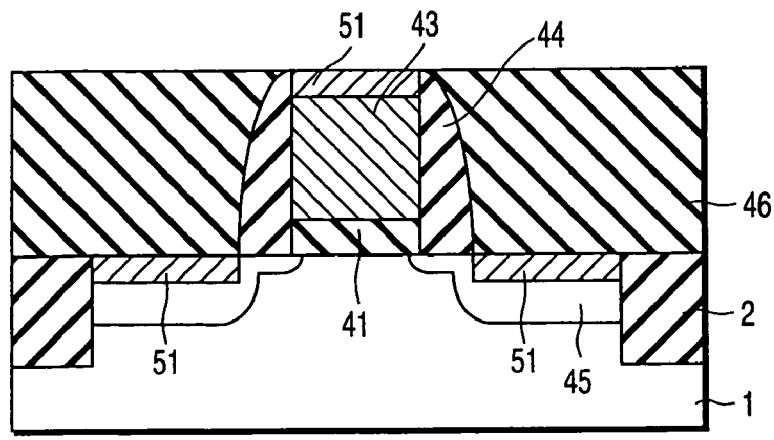
F I G. 14A
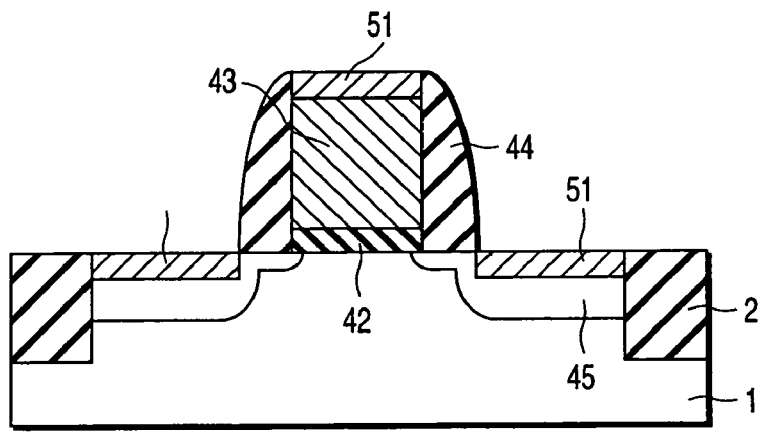
F I G. 14B
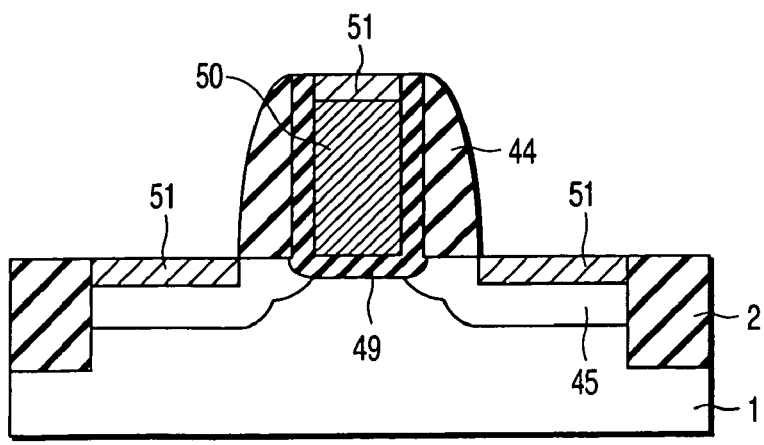
F I G. 14C

SEMICONDUCTOR DEVICE AND METHOD OF MANUFACTURING THE SAME

CROSS-REFERENCE TO RELATED APPLICATIONS

This is a divisional of application Ser. No. 10/660,559, filed on Sep. 12, 2003 now U.S. Pat. No. 6,977,415, which claims the benefit of priority to Japanese Patent Application No. 2002-266759, filed on Sep. 12, 2002, and Japanese Patent Application No. 2003-318143, filed on Sep. 10, 2003, the contents of all of which are incorporated herein by reference in their entireties.

BACKGROUND OF THE INVENTION

1. Field of the Invention

The present invention relates to a structure of an element provided with a gate electrode and a source/drain region, which are required for miniaturization, and a method of manufacturing the same.

2. Description of the Related Art

In recent years, a semiconductor device is required for miniaturization more and more. Particularly a shallower junction is demanded in MISFET (Metal Insulated Semiconductor Field Effect Transistor) and MOSFET (Metal Oxide Semiconductor Field Effect Transistor). However, there are limits of formation of the shallow junction in the conventional method as the miniaturization is proceeding. The conventional method of manufacturing a MISFET will be described below referring to FIGS. 21A to 21D. FIGS. 21A to 21D are sectional views of the method of manufacturing a MISFET having the conventional structure.

As shown in FIG. 21A, an element isolation region 102 is formed in a semiconductor substrate 101 made of silicon using STI (Shallow Trench Isolation) technology or the like. The semiconductor substrate 101 is, e.g. an n-type semiconductor. Then, gate formation is carried out in such a manner that, e.g. a gate nitride-oxide film having a thickness of about 1 nm is formed as a gate insulating film 103 and a polysilicon film 104 having the thickness of 100 nm is formed as a gate electrode 104. A p-type extension region 105, which is the shallow portion of the source/drain region, is formed using ion implantation technology. A thermal process after the ion implantation is carried out to the extent to which a crystal broken by the ion implantation is recovered. Specifically it is sufficient to carry out RTA (Rapid Thermal Annealing) at 800° C. for several seconds.

As shown in FIG. 21B, using deposition of a silicon nitride film, a silicon oxide film, or the like and etching, a gate side-wall insulator 106 is formed on a side face of the gate electrode 104, and a contact junction region 107 which is a deep junction portion of the source/drain is formed. The same impurity for the contact junction region 107 is also doped into the gate electrode 104 by the ion implantation into the contact junction region 107.

As shown in FIG. 21C, in order to activate the ion doped into the contact junction region 107 and the gate electrode 104, an activation process is carried out at a temperature not lower than 1000° C. That such a high temperature is required is because depletion of the gate is suppressed. This heat treatment forms an extension region 108 which is deeper than the extension region 105.

As shown in FIG. 21D, using silicide technology, a silicide layer 109 made of Co, Ni, or the like is formed on a surface of the contact junction region 107 and a top surface of the gate electrode 104, on which silicon is exposed.

The MOSFET element referred usually to as silicide gate is completed by the above-described process. The conventional method of manufacturing the MISFET and its problem will be described below referring to FIGS. 22 to 25. FIG. 22 is a concentration distribution of As in a depth direction of a silicon wafer which the ion implantation of As (arsenic) has been carried out in an extremely shallow portion, and FIG. 23 is a concentration distribution of B in the depth direction of the silicon wafer which the ion implantation of B (boron) has been carried out in the extremely shallow portion. FIGS. 24A and 24B are enlarged views showing an edge of the gate electrode of the semiconductor substrate in which the MISFET is formed. FIG. 25 is a sectional view of the MISFET in which the extension regions are connected between the source region and the drain region.

One of the problems concerning the miniaturization of the MOSFET is that the extension region 105, which is the shallow junction, is deepened by the heat treatment not lower than 1000° C. FIGS. 22 and 23 are the concentration distributions of As and B in the depth direction of the silicon wafer which the ion implantation of As and B have been carried out in the extremely shallow portion, respectively. In these cases, the concentration distribution is compared before and after the heat treatment at 1085° C. As can be seen from FIGS. 22 and 23, in the case that only the heat treatment at 800° C. for several seconds is carried out, even if the current ion implantation technology is adopted, it is found that the junction of about 10 nm is formed. Junction depth is a position where the concentration of As or B becomes equal to channel concentration. The channel concentration is the region where the concentration is in the range from about $1 \times 10^{18}/cm^3$ to about $1 \times 10^{19}/cm^3$ in the case that gate length is not more than 50 nm. However, in the case of the heat treatment at 1085° C., it is found that the junction depth of boron becomes about 30 nm.

FIGS. 24A and 24B are the enlarged views showing the edge of the gate electrode of the semiconductor substrate in which the MOSFET is formed. FIGS. 24A and 24B show states of the extension region 105 before the heat treatment not lower than 1000° C. and the extension region 108 which has been deepened after the heat treatment. The extension region 108 also extends in a lateral direction at the same time the extension region 108 is deepened after the heat treatment. That the extension region 108 extends in the lateral direction is because a high concentration region 110 not lower than $1 \times 10^{19}/cm^3$ becomes a diffusion source. Usually the amount of lateral extension is about two-third in the depth (A) direction (A×⅔). Estimating the amount of extension from FIG. 22, it is found that the extension region laterally extends not lower than 20 nm as shown in FIG. 24B. Therefore, as shown in FIG. 25, when the gate length becomes not more than 40 nm, the extension regions are connected between the source and the drain and operation of the MOSFET can no longer be realized.

Thus, in order to prevent the extension regions from connecting, there is known a technology which cuts off the connection of the extension regions by ion-implanting a reversely conductive type impurity into the extension region (for example, a p-type impurity is ion-implanted in the case that the extension region is the n-type) to decrease substantially impurity concentration and by reducing the extent of the region acting as the extension region. However, this technology not only complicates the process but also results in degradation of transistor performance, so that it is an undesired method.

BRIEF SUMMARY OF THE INVENTION

A semiconductor device according to an aspect of the present invention comprises: a semiconductor substrate having a recess whose depth is not more than 6 nm; a source region and a drain region which are formed in a surface region of the semiconductor substrate so as to sandwich the recess, each of the source region and the drain region being constituted of an extension region and a contact junction region; a gate insulating film formed between the source region and the drain region in the semiconductor substrate; and a gate electrode formed on the gate insulating film.

In a semiconductor device according to an aspect of the present invention, a plurality of MIS transistors comprising a semiconductor substrate, a source region and a drain region which are formed in a surface region of the semiconductor substrate, each of the source region and the drain region being constituted of an extension region and a contact junction region, a gate insulating film formed between the source region and the drain region in the semiconductor substrate, and a gate electrode formed on the gate insulating film are formed, and the source region and the drain region of a part of the plurality of MIS transistors are formed so as to sandwich the recess which is formed in the semiconductor substrate and whose depth is not more than 6 nm.

A method of manufacturing a semiconductor device, according to an aspect of the present invention, comprises: forming a dummy gate insulating film on a semiconductor substrate, and forming a dummy gate electrode on the dummy gate insulating film; carrying out ion implantation of an impurity into a surface region of the semiconductor substrate by using the dummy gate insulating film and the dummy gate electrode as a mask, and forming an extension region; forming a gate sidewall insulating film on side faces of the dummy gate insulating film and the dummy gate electrode; doping the impurity into a surface region of the semiconductor substrate by using the dummy gate insulating film, the dummy gate electrode and the gate sidewall insulating film as a mask to form a contact junction region, and forming a source region and a drain region which are constituted of the contact junction region and the extension region; forming an interlayer insulating film on the semiconductor substrate so as to cover the dummy gate insulating film, the dummy gate electrode, and the gate sidewall insulating film; polishing the interlayer insulating film until a surface of the dummy gate electrode is exposed, and planarizing the surface; removing selectively the dummy gate insulating film and the dummy gate electrode to form a gate opening region in the interlayer insulating film; forming a recess on the surface region of the semiconductor substrate by oxidizing the surface of the semiconductor substrate which is exposed on a bottom portion of the gate opening region and by removing selectively the oxidized part; insulating the surface of the recess in a bottom surface of the gate opening region to form a gate insulating film; and burying a gate electrode material in the gate opening region to form a gate electrode.

BRIEF DESCRIPTION OF THE SEVERAL VIEWS OF THE DRAWING

FIGS. 14A to 14C are sectional views showing the method of manufacturing a MISFET according to the third embodiment;

DETAILED DESCRIPTION OF THE INVENTION

Referring to the accompanying drawings, embodiments of the invention will be described below.

First Embodiment

Figure 1A:
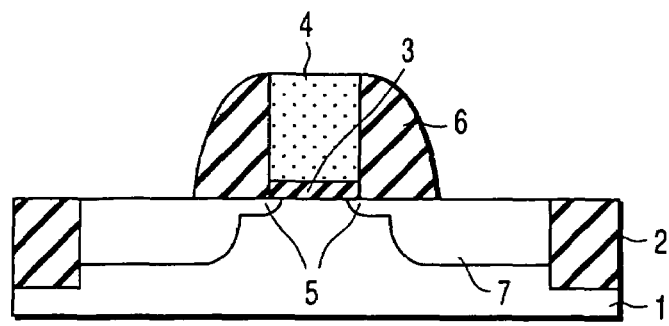
FIGS. 1A to 1J are sectional views of a process of manufacturing a MISFET having a gate electrode made of polysilicon according to a first embodiment of the invention.
Figure 1B:
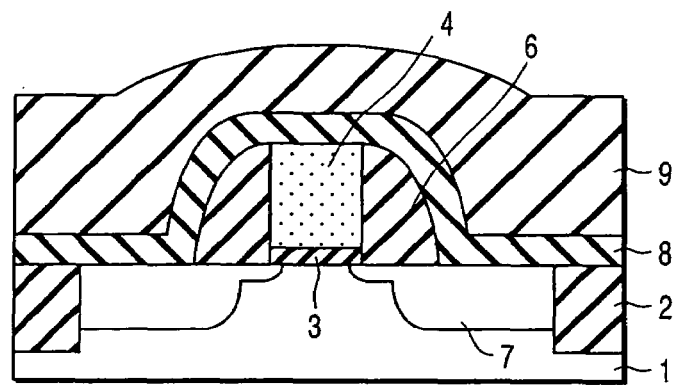
Figure 1C:
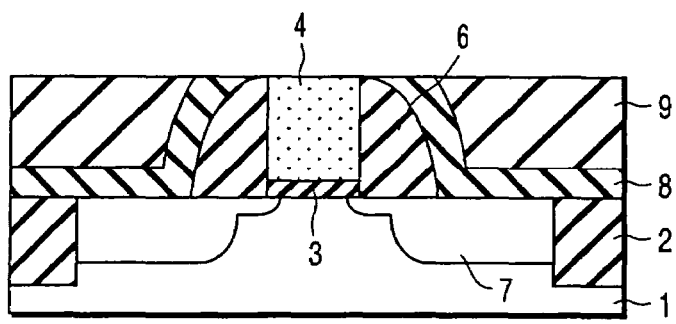
Figure 1D:
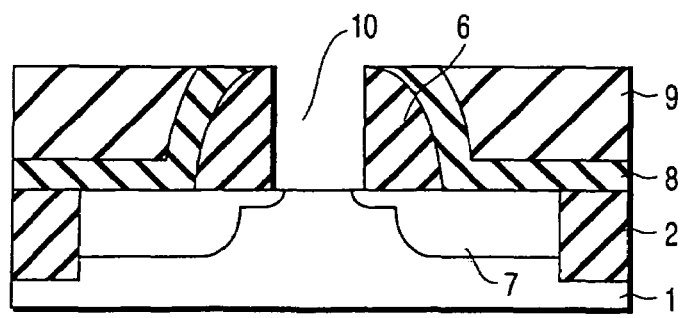
Figure 1E:
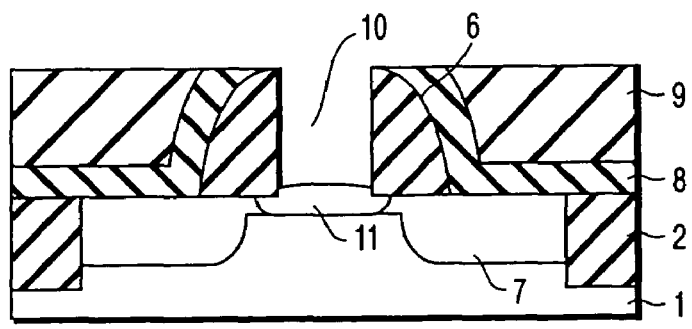
Figure 1F:
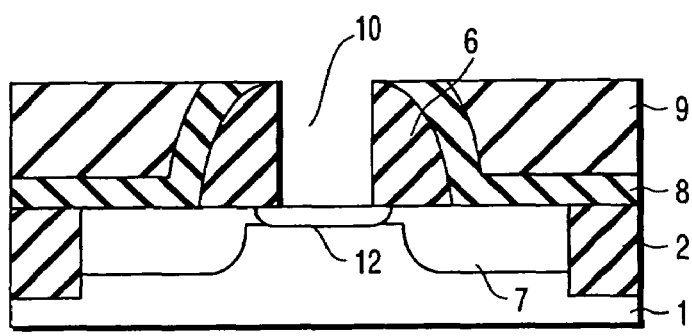
Figure 1G:
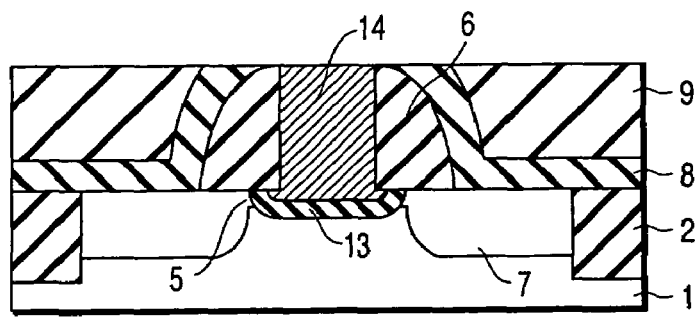
Figure 1H:
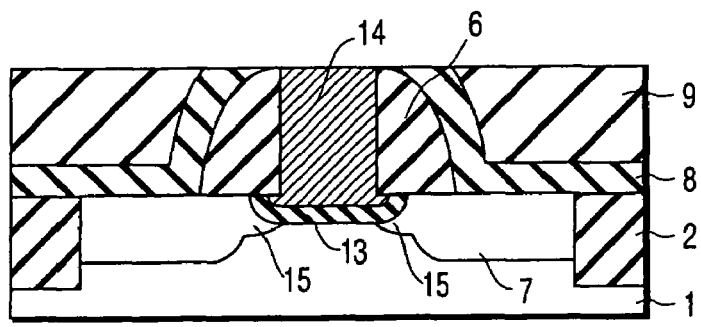
Figure 1I:
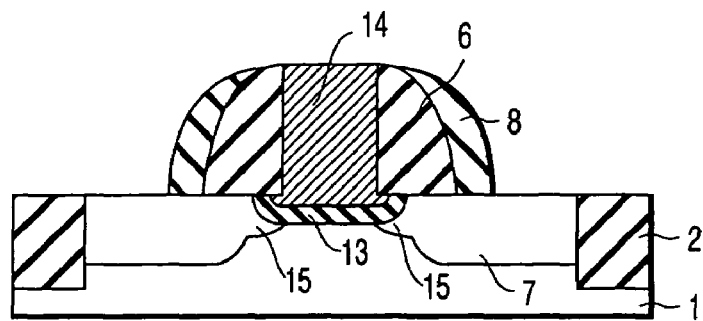
Figure 1J:
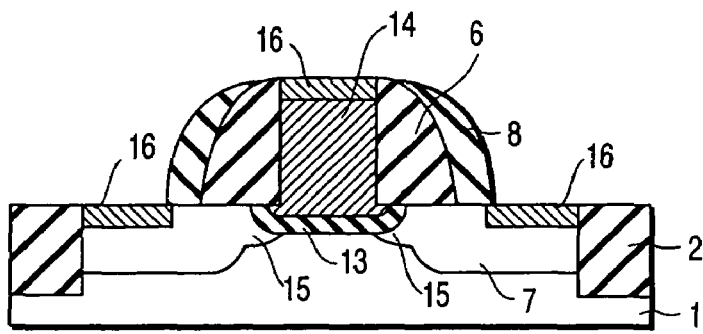
Figure 2:
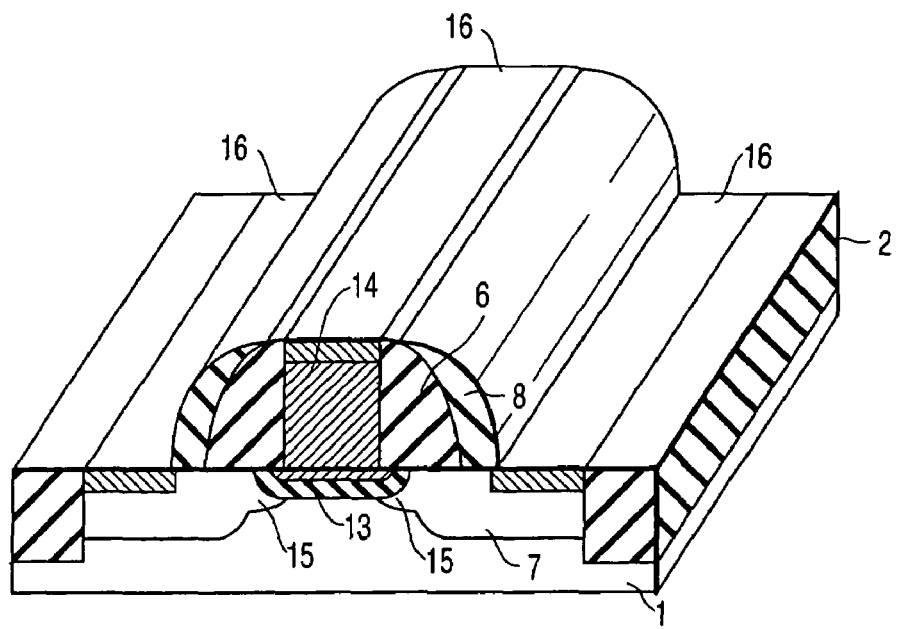
FIG. 2 is a perspective view of the MISFET shown in FIG. 1J.

FIGS. 1A to 1J are sectional views of a process of manufacturing a MISFET having a gate electrode made of polysilicon, and FIG. 2 is a perspective view of the MISFET shown in FIG. 1J. A method of forming a MISFET in the embodiment is shown in order of process. The reason why such a process is applied will be described after description of the forming method. In STEP 1 shown in FIG. 1A, element isolation regions 2 are formed in a surface region of a semiconductor substrate 1 such as silicon by the STI technology or the like, and then an oxide film of a dummy gate which is removed later is formed. Then, for example, a polysilicon film is formed as an electrode material of the dummy gate which is removed later. A dummy gate electrode 4 and a dummy gate insulating film 3 are formed by carrying out gate formation to the polysilicon film and the oxide film. The dummy gate insulating film 3 may have a thickness of about 6 nm. Though an extremely thin film having the thickness of about 1.0 nm is required for the conventional gate isolation, this process-does not require such an extremely thin film because the process uses the dummy. Accordingly, the gate insulating film which becomes a stopper has the thickness of as thick as 6 nm, so that the gate forming of the polysilicon film is very easy to carry out, as compared with the prior art. Similarly to the prior art, using the ion implantation technology, an extension region 5, a gate sidewall insulating film 6, and a contact junction region 7 are formed.

After the ion implantation, the heat treatment at about 800 is carried out for, at most, recovering the crystal. This enables the depth of the extension region to be formed not more than 10 nm. For example, the semiconductor substrate is n-type and the extension region is p-type.

STEP 2 will be described below referring to FIG. 1B. In STEP 2, an interlayer insulating film is formed on the dummy gate electrode. For example, a liner silicon nitride film (SiN) 8 and a silicon oxide film. ($SiO_2$) 9, which become an etching stopper later, are deposited in order as the interlayer insulating film.

STEP 3 will be described below referring to FIG. 1C. In STEP 3, the liner silicon nitride film. (SiN) 8 and the silicon oxide film ($SiO_2$) 9, which constitute the interlayer insulating film, are polished by a CMP (Chemical Mechanical Polishing) technology or the like. Until the dummy gate electrode 4 is exposed, the polishing is carried out to planarize the surface of the interlayer insulating film.

STEP 4 will be described below referring to FIG. 1D. In STEP 4, the dummy gate electrode 4 exposed from the interlayer insulating film is selectively removed. The removal is easy to carry out, e.g. adopting an etching method using plasma. Then, the dummy gate insulating film 3 is removed by using acid such as dilute hydrofluoric acid. Accordingly, the surface of a channel region of the semiconductor substrate 1 is exposed. In the interlayer insulating films 8 and 9, marks of the dummy gate electrode and gate oxide film are formed as a gate opening groove 10.

STEP 5 will be described below referring to FIG. 1E. In STEP 5, the surface of the channel region exposed on a bottom surface of the gate opening groove 10 is oxidized. The surface of the channel region is oxidized with plasma oxygen to form a plasma oxide film 11. The amount of oxidization may be the film thickness of the order of 12 nm. The oxidizing temperature is not more than 600° C., preferably it is not more than 500° C.

STEP 6 will be described below referring to FIG. 1F. In STEP 6, the plasma oxide film 11 is removed. The plasma oxide film 11 formed on the surface of the channel region is selectively removed, e.g. by using dilute hydrofluoric acid. Accordingly, the surface of the channel region is recessed to form a recessed channel 12. The depth of the recessed channel region (hereinafter referred to as recess quantity) is half of the film thickness of the plasma oxide film 11. Therefore, the recess quantity is about 6 nm in the recessed channel 12.

STEP 7 will be described below referring to FIG. 1G. In STEP 7, the gate electrode and the gate insulating film are formed. A gate insulating film 13 is formed with a silicon oxide-nitride film in which the oxide film having the thickness of about 1.0 nm is formed, e.g. by the plasma oxidation and then the surface of the oxide film is nitrided, e.g. by plasma nitrization. Since all the films are formed by the process using the plasma, it is possible to form the film at a temperature not more than 600° C. Then, the gate electrode material is buried in the gate opening groove 10 to form a gate electrode 14. For example, there is a burying method in which the gate electrode material is deposited over the semiconductor substrate 1 and the film of the gate electrode material is planarized by CMP or the like. In the embodiment, polysilicon is used as the gate electrode material. In the embodiment, metal or its alloy, a mixture of silicon and germanium, and the like may be used as the gate electrode material.

STEP 8 will be described below referring to FIG. 1H. In STEP 8, the heat treatment is carried out to the formed gate electrode. The gate electrode material is polysilicon in the embodiment. Since the gate electrode 14 is polysilicon, the impurity such as arsenic (As), phosphorus (P), or boron (B) is introduced into the gate electrode 14 by the ion implantation. Then, activation heat treatment is carried out at a temperature not lower than 1000° C. in order to activate the impurity doped into the gate electrode 14. The extension region 5 is also deepened by the heat treatment and an extension region 15 having the deeper diffusion depth is formed.

STEP 9 will be described below referring to FIG. 1I. In STEP 9, the interlayer insulating film 9 is selectively removed, e.g. by using hydrofluoric acid. Then, the surface of the contact junction region 7 is exposed in such a manner that anisotropic etching such as RIE (Reactive Ion Etching) is carried out to the liner silicon nitride film 8.

STEP 10 will be described below referring to FIG. 1J and FIG. 2. FIG. 2 is a perspective view of the MISFET shown in FIG. 1J. In STEP 10, using the silicide process, a silicide layer 16 made of Co, Ni, or the like is selectively formed on the upper surfaces of gate electrode 14 and the contact junction region 7, on which silicon is exposed.

The MISFET, which is the semiconductor device according to the first embodiment, is formed through the above-described steps. As described in STEP 5 and STEP 6, the embodiment is characterized by forming the recessed channel. The recessed channel means the channel region in which the recess is provided in the semiconductor substrate under the gate electrode.

Though the recessed channel has been proposed (see the concave type MISFET described above), there is a basic difference between the embodiment and the prior art. First the embodiment uses the plasma oxide film. In the prior art, there has also been proposed the method in which the oxide film is formed with the thermal oxide film and the etching is carried out to the oxide film. However, in this method, since the treatment at a temperature at least 700° C. for more than several minutes is required in order to form the oxide film having the thickness of 12 nm, there is the problem that the impurity in the extension region is diffused through this heat treatment and the extension region is deepened.

On the contrary, as shown in the embodiment, since the plasma oxidation is used, the oxidation temperature is as low as 600° C. and the impurity of the extension region is never diffused during the oxidation. Though the recess quantity of the channel region is half of the thickness of the oxide film, since the thickness of the plasma oxide film can be currently controlled within an error range not more than 0.2 nm in a wafer surface, the error of the recess quantity of the channel region can be controlled not more than 0.1 nm, so that the transistor in which variation of threshold is very small in the wafer surface can be formed.

The above is a first operation-effect described in the first embodiment and a point different from the conventional semiconductor device having the recessed channel.

Next another operational-effect superior to the conventional semiconductor device will be described.

Figure 3A:
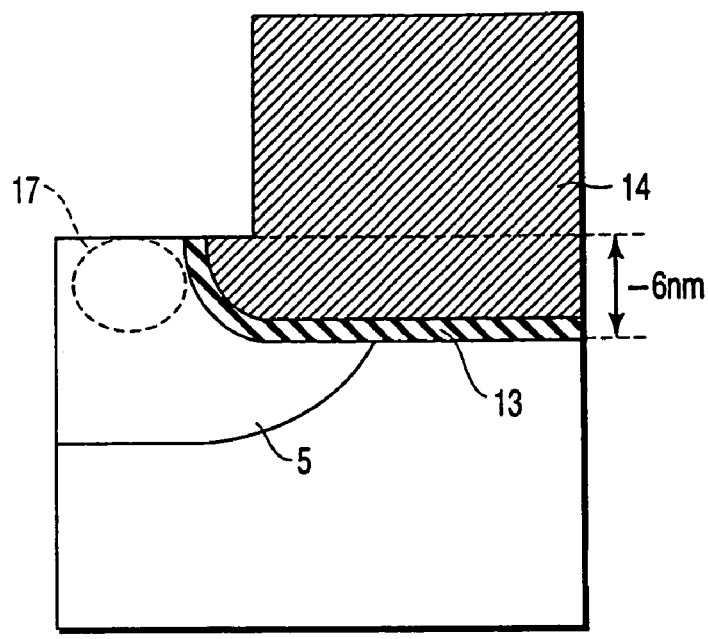
FIGS. 3A and 3B are plan views of a semiconductor substrate in which a part including an end of the gate electrode is enlarged before and after heat treatment, for explaining operation-effect in the first embodiment of the invention.
Figure 3B:
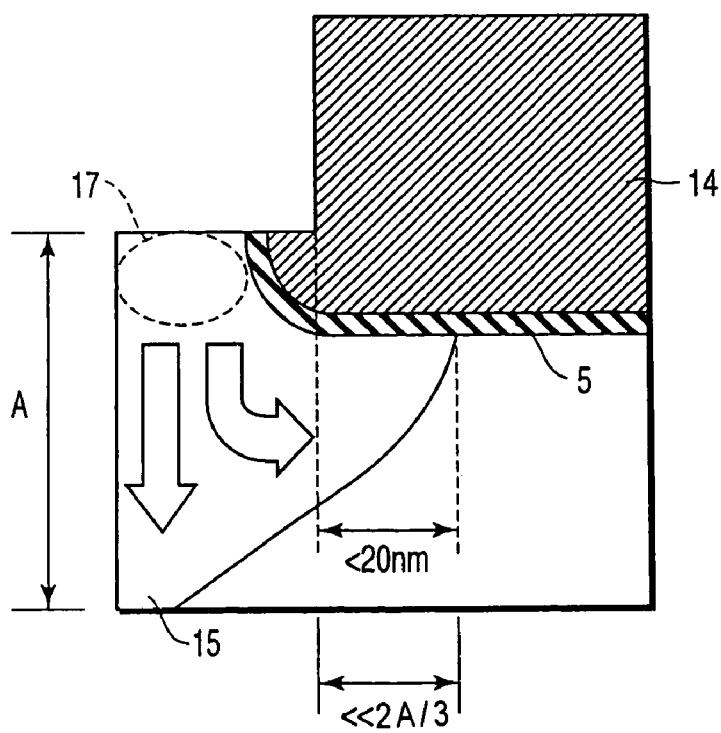

FIGS. 3A and 3B are plan views in which a part including an end of the gate electrode is enlarged in STEP 7 and STEP 8, respectively. FIG. 3A shows a part of the extension region before the heat treatment, and there is a high-concentration diffusion region 17 (corresponding to reference numeral 110 in FIGS. 8A to 8C, FIGS. 9A to 9C, and FIGS. 10A to 10C) within the extension region 5 in the surface region of the semiconductor substrate 1. The depth of the extension diffusion layer 5 shown in FIG. 3A is not more than 10 nm before the activation heat treatment for the gate electrode is carried out at a temperature not lower than 1000° C. in STEP 8. In the prior art, by carrying out the heat treatment at 1000° C., the high-concentration diffusion region 17 not lower than $1 \times 10^{19}/cm^3$ becomes the diffusion source of the lateral diffusion, which allows the extension region 5 to laterally spread not lower than 20 nm. Since the amount of lateral diffusion is about two-third of the amount of diffusion in the depth direction, the amount of diffusion in the depth direction is about 30 nm.

However, the channel region is recessed by the depth of the high-concentration diffusion region (about 6 nm) in the embodiment. Accordingly, as shown in FIG. 3B, the high-concentration diffusion region 17 can not be directly diffused in the lateral-direction. FIG. 3B shows a part of the extension region after the heat treatment. The extension region 15 after the heat treatment not lower than 1000° C. is remarkably decreased in the lateral diffusion, as compared with the prior art. That is, as shown in FIG. 3B, the amount of lateral diffusion is sufficiently smaller than about two-third of the amount of diffusion in the depth direction (A) (<<2A/3). In other words, the amount of lateral diffusion is sufficiently smaller than 20 nm.

The above is a second operation-effect described in the first embodiment.

In the conventional method of forming a MISFET having a recessed channel, there is a report in which the whole depth of the extension diffusion layer is recessed, and the recess quantity is at least 10 nm in the concave type MISFET described in the prior art. However, the MISFET in the embodiment completely differs from the MISFET described in the prior art. That is, the recess quantity of the channel region may be recessed by only the depth of the high-concentration diffusion region 17 not lower than $1 \times 10^{19}/cm^3$ in the extension region before the heat treatment not lower than 1000° C.

Figure 25:
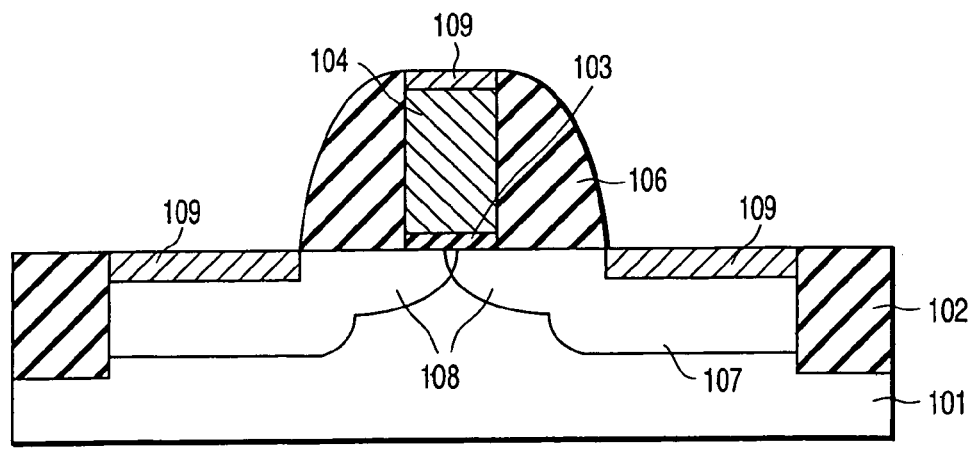
FIG. 25 is a partially sectional view of the semiconductor substrate, for explaining the problem of the method of manufacturing the conventional semiconductor device.

It is not absolutely necessary to recess the whole depth of the extension region, and the extension region must be one before carrying out the heat treatment, such as the heat treatment not lower than 1000° C., in which the depth of the high-concentration diffusion region in the extension region becomes not lower than 6 nm. That is, in the case that the channel region is. recessed after the heat treatment not lower than 1000° C. is carried out, the extension regions have been already connected between the source and the drain as shown in FIG. 25 of the conventional example, the transistor operation is not realized any more, even if the channel region is recessed by about 6 nm. The embodiment differs from the conventional method in this point. In the conventional method, the channel region is recessed after the extension region is completely formed.

In the embodiment, the heat treatment such as the heat treatment not lower than 1000° C., which deepens the extension region, is carried out after the channel region is recessed. The channel region may be recessed after the heat treatment, in the case that even the heat treatment not lower than 1000° C. is carried out for extremely shot time in which the extension region is not deepened.

Further, the embodiment is characterized in that the channel region is recessed by the depth of the high-concentration diffusion region while the depth of the high-concentration diffusion region, which is not lower than $1 \times 10^{19}/cm^3$ and preferably not lower than $1 \times 10^{18}/cm^3$, in the extension region is not more than 6 nm and preferably in the range of 2 to 6 nm. Accordingly, the extension region 15 formed in the embodiment differs from the extension region of the conventional example in the two-dimensional spread of the diffusion of the impurity. A spreading manner can not be generally defined because the spreading manner is varied by conditions of the ion implantation and the like. However, it is possible to easily know difference between the embodiment and the conventional example by simulation or the like. In brief, the extension region located under the gate electrode is formed in such a manner that the impurity in the high-concentration diffusion region located beside the gate electrode is mainly diffused. Consequently, a shape of the spreading manner is naturally determined. That is, the extension region located under the gate electrode has the shape sufficiently smaller than about two-third of a distance in the depth direction of the extension region. In a channel length, it is possible to secure the sufficient length for maintaining the transistor characteristics even if the miniaturization further proceeds. In the method, which is used for the conventional concave type transistor described above and forms the recessed channel by the thermal oxidation treatment and the etching, since the impurity of the high-concentration diffusion region in the extension region is thermally diffused at the time when the thermal oxidation is carried out, it is impossible to form the impurity diffusion region like the embodiment.

In summary, advantages of the embodiment are as follows.

1) The method of recessing the channel region is to remove the plasma oxide film in the channel region by the oxidation, which uses the oxidizing technology with the plasma oxygen at a temperature not more than 600° C. and preferably not more than 500° C., and the wet etching technology 2) In the recess quantity of the channel region, the channel region may be recessed by only the depth of the high-concentration diffusion region, which is not lower than $1 \times 10^{19}/cm^3$ and preferably not lower than $1 \times 10^{18}/cm^3$, in the extension region. The specific recess quantity of the channel region is not more than 6 nm and preferably in the range from 2 nm to 6 nm. The heat treatment is carried out so that the depth of the high-concentration diffusion region in the extension region becomes at least not more than 6 nm and preferably in the range from 2 nm to 6 nm at the time when the channel region is recessed. Specifically, in the extension region, the heat treatment should be carried out at a temperature utmost about 800° C. for not more than several minutes, or the heat treatment should keep the short time such that the depth of the high-concentration diffusion region not lower than $1\times10^{19}/\text{cm}^3$ becomes not more than 6 nm and preferably in the range from 2 nm to 6 nm even in a temperature not lower than 1000° C., until the channel region is recessed. After the channel region is recessed, there is no problem even if the heat treatment in which the depth of the high-concentration diffusion region becomes not lower than 6 nm is carried out.

3) The extension region located under the gate electrode is sufficiently smaller than about two-third of the distance in the depth direction of the extension region.

Though the above is the description of the advantages of the embodiment, in the method of recessing the channel region, the semiconductor substrate may directly etched by dry etching or wet etching instead of the plasma oxidation. Though the method of recessing the channel region has been already proposed, the embodiment differs from the conventional method in the above-described 2).

The polysilicon gate is used in the embodiment. However, the gate electrode made of the mixture of silicon and germanium may also exert the same effect.

Further, the same effect is exerted in the metal gate which does not require the heat treatment for activating the impurity in the gate electrode. Because the impurity is not sufficiently activated and the junction is too shallow in the extension region before the heat treatment not lower than 1000° C. is carried out, sheet resistance of the extension region is too high and high-performance of the transistor can not be achieved. That is, the high-performance of the transistor can be achieved, when the impurity in the extension region is further activated and the extension region is deepened to a certain extent to reduce the resistance of the extension region. In the embodiment, even if the extension region is deepened, the lateral diffusion can be remarkably suppressed, so that there is no problem even if the heat treatment not lower than 1000° C. is carried out to deepen the extension region to a certain extent. Accordingly, in the metal gate, there is no problem in the transistor characteristics, even if the heat treatment is carried out after at least the channel is recessed so that the extension region becomes not lower than 20 nm.

Second Embodiment

A second embodiment of the invention will be described below referring to FIGS. 4A to 4D.

FIGS. 4A to 4D are sectional views of a process of manufacturing a MISFET having a gate electrode made of-metal. Complementary transistors, which include an n-type MISFET and a p-type MISFET, will be described in the second embodiment. When the complementary transistors are formed, since the process to which the gate electrode material such as WSix is buried (FIG. 4A) is the same for the first embodiment until the process of FIG. 1H, the description is omitted. By this time the heat treatment not lower than 1000° C. (after forming the recess or after forming the gate oxide) has been carried out to the semiconductor substrate in order to reduce the resistance of the source/drain region, so that a deep extension region 30 is formed in FIG. 4A.

Figure 4A:
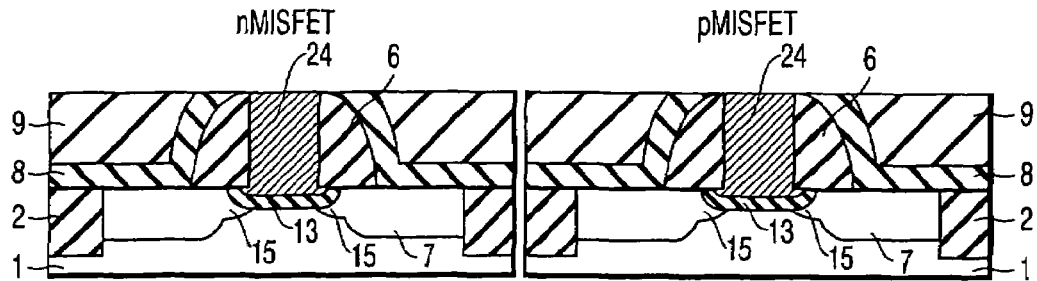
FIGS. 4A to 4D are sectional views of a process of manufacturing a MISFET having a gate electrode made of metal according to a second embodiment of the invention.

In FIG. 4A, the left side of FIG. 4A is the n-type MISFET and the right side is the p-type MISFET. Both MISFETs have the source/drain region including the deep extension region 30 after the heat treatment and a contact junction region 27, which are formed in an element region separated by element isolation regions 22 formed in a semiconductor substrate 21 such as silicon by the STI technology or the like. A gate electrode 24 made of a material such as WSix is buried in an interlayer insulating film 26 made of a silicon nitride film and a silicon oxide film. A recess, in which a part of the gate electrode is buried, is formed in a channel region of the semiconductor substrate 21, and a gate insulating film 23 is interposed between the semiconductor substrate 21 and the gate electrode 24.

Figure 4B:
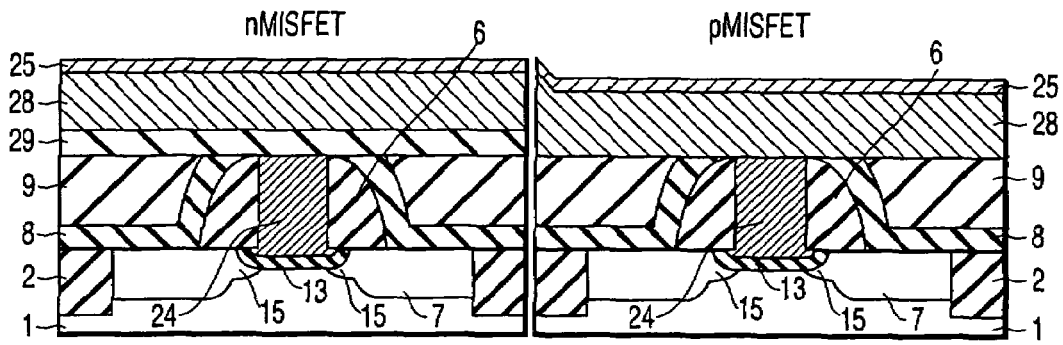

As shown in. FIG. 4B, a Pt film 28 covering the gate electrode 24 is formed on the semiconductor substrate 21. On the side of the n-type MISFET, a barrier layer 29 made of, e.g. TiN is further formed between the gate electrode 24 and the Pt film 28. Then, a barrier layer 25 made of a material such as TiN having the thickness of about 20 nm is formed in the Pt film 28 so that the heat treatment is stably carried out.

Figure 4C:
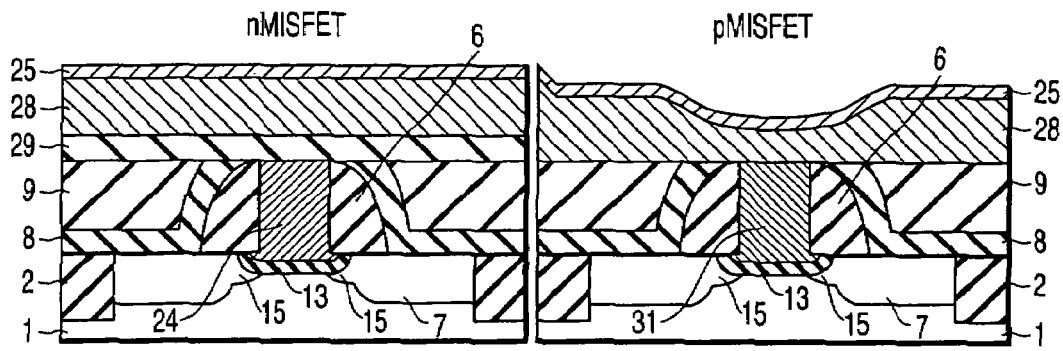

The heat treatment is carried out to the semiconductor substrate 21 at a temperature of about 500° C. after covering the Pt film 28 and the like. As shown in FIG. 4C, the gate electrode 24 on the side of the P-type MISFET is reacted with the Pt film by the heat treatment and changed into a gate electrode 31 made of W+PtSi+WSix. On the side of the n-type MISFET, since the barrier layer 29 blocks the reaction of Pt and WSix, the gate electrode 24 exists as it is.

Figure 4D:
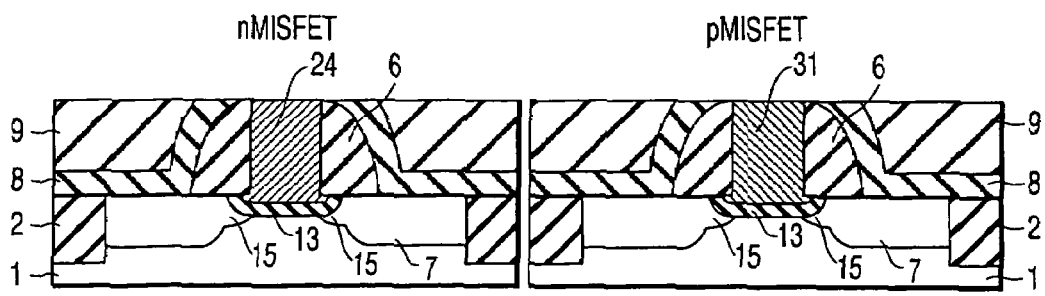

As shown in FIG. 4D, the Pt film and the TiN barrier layer are removed by using, e.g. aqua regia. Then, a post-process is carried out. In the above-described way, the complementary MISFET having the metal gate is formed.

Thus, the technique described in the embodiment can be applied to MISFET having the metal gate. Also in the metal gate, there is no problem in the transistor characteristics, even if the heat treatment is carried out after at least the channel is recessed such that the extension region becomes not lower than 20 nm.

The recess quantities of the channel regions may be changed in the n-type MISFET and the p-type MISFET, respectively. The recess quantities of the channel regions can be independently changed in the n-type MISFET and the p-type MISFET in such a manner that, for example, only the dummy gate in the n-type MISFET is removed after STEP 3, the process is carried out in order to STEP 7, only the dummy gate in the p-type MISFET is removed, and then the process is carried out to STEP 7. Though it is common in a damascene process, the ion implantation of the impurity of the channel may be carried out at least after removing the dummy gate electrode. Further, various combinations can be carried out by using the technique of forming the gate insulating film, the technique of forming the gate electrode, or the like which has been already reported, in the case that it does not deviate from a scope of the embodiment.

Figure 5:
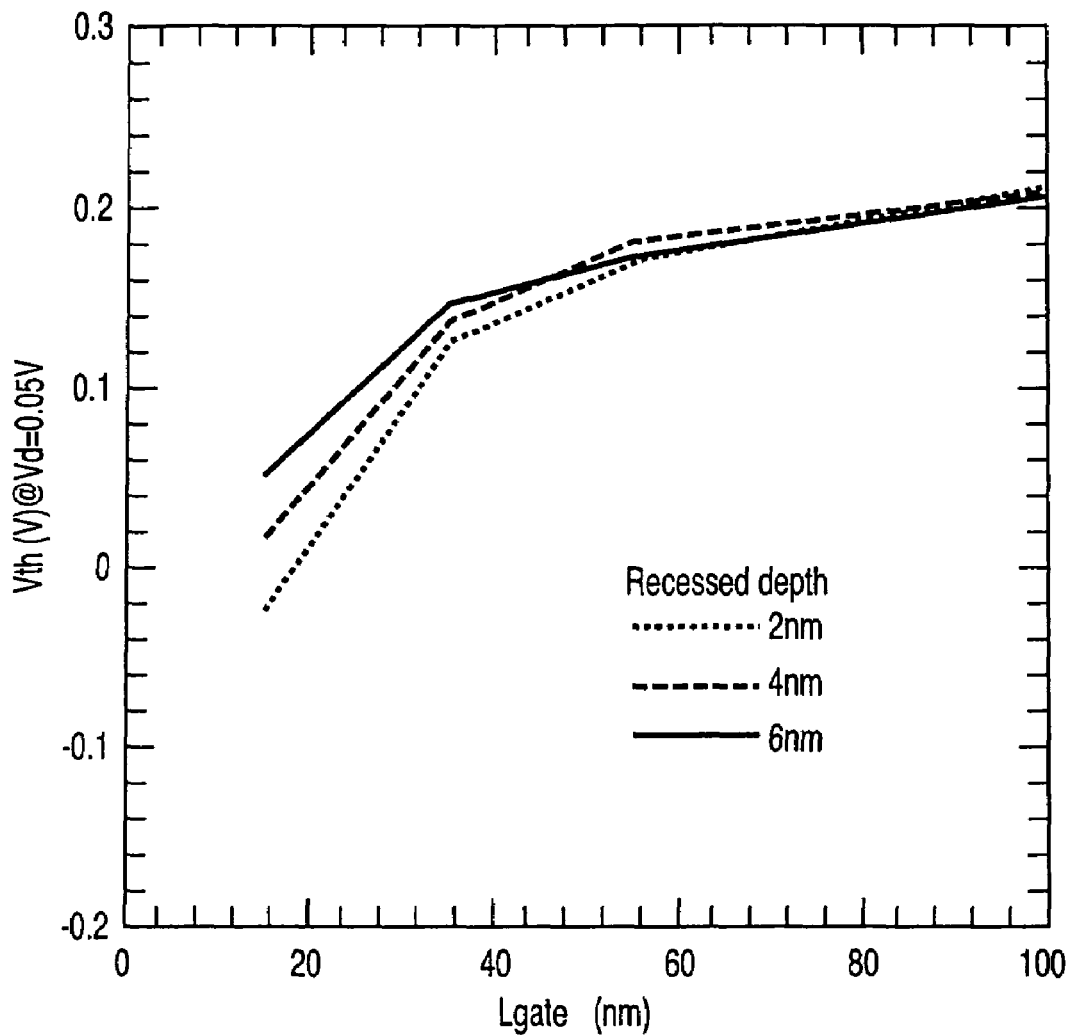
FIG. 5 is a plot showing dependence of a threshold on a gate length in a semiconductor device of the invention.

The transistor is manufactured by way of trial by the method of manufacturing a semiconductor device of the embodiment and its result of characteristics is shown. FIG. 5 is a plot showing dependence of a threshold on a gate length in the transistor. A vertical axis shows a threshold (Vth (V)) and a horizontal axis shows a gate length (Lgate (nm)) of the transistor. As shown in FIG. 5, it is found that short channel effect in which the threshold is decreased in the short gate length is improved, as the recessed depth (recess quantity) of the channel region is increased from 2 nm to 6 nm. When the recess quantity is 6 nm, the good transistor characteristics are shown even in the gate channel of 35 nm. The transistor is naturally formed by using the current ion implantation technology and activation heat treatment technology. It is found that the gate length of 15 nm can be also operated in the case that the heat treatment is slightly improved (specifically, in the case that the heat treatment not lower than 1000° C. is shortened).

Third Embodiment

Since the manufacturing method which avoids the problem in the prior art is invented, its contents will be described in the order of the process.

A third embodiment of the invention provides a technique realizing a structure, in which a DRAM and a peripheral circuit are formed with a MISFET having a thick gate oxide and a polysilicon gate electrode and only a high-speed logic circuit is formed with a MISFET having a high dielectric gate insulating film and a recessed channel capable of forming a shallow junction.

The third embodiment will be described referring to FIGS. 6A to 14A, FIGS. 6B to 14B, and FIGS. 6C to 14C. FIGS. 6A to 14A, FIGS. 6B to 14B, and FIGS. 6C to 14C are sectional views showing the method of manufacturing a MISFET according to the third embodiment of the invention. FIG. nA shows a DRAM, FIG. nB shows a peripheral circuit, and FIG. nC shows a high-speed logic circuit (n=6 to 14).

Figure 6A:
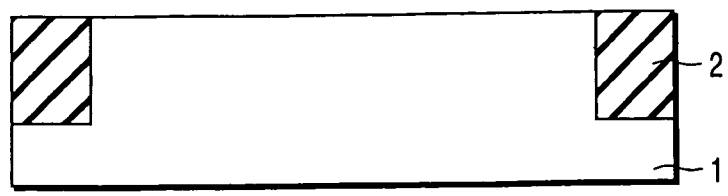
FIGS. 6A to 6C are sectional views showing a method of manufacturing a MISFET according to a third embodiment of the invention.
Figure 6B:
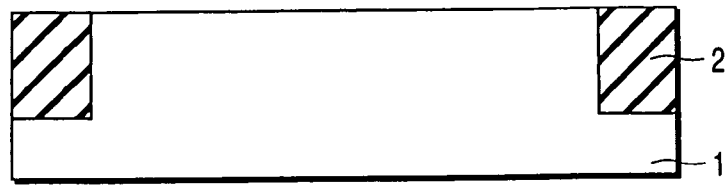
Figure 6C:
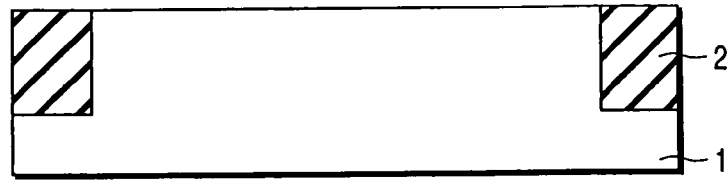

First, for example, a trench capacitor (not shown) which becomes a capacitor of the DRAM is formed in the silicon substrate 1 of the DRAM. As shown in FIGS. 6A to 6C, the element isolation region 2 is formed by using the STI technology.

Figure 7A:
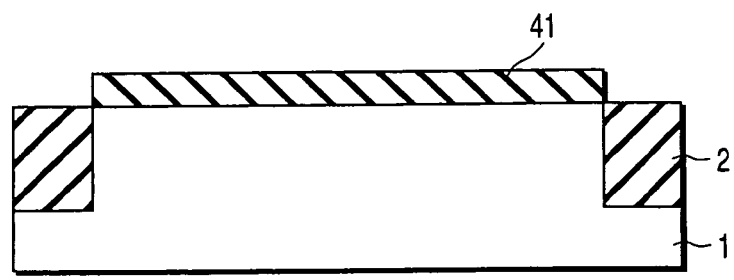
FIGS. 7A to 7C are sectional views showing the method of manufacturing a MISFET according to the third embodiment.
Figure 7B:
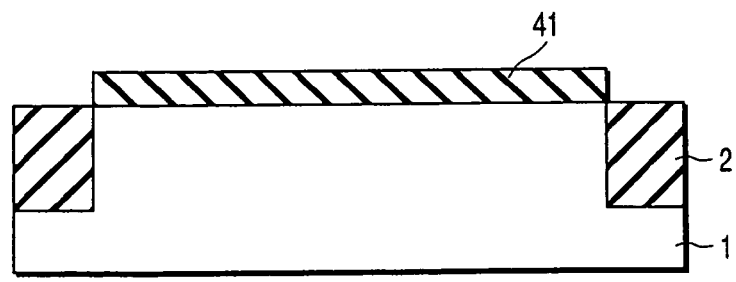
Figure 7C:
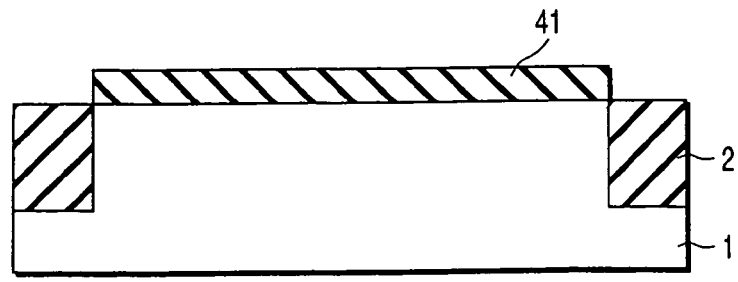
Figure 8A:
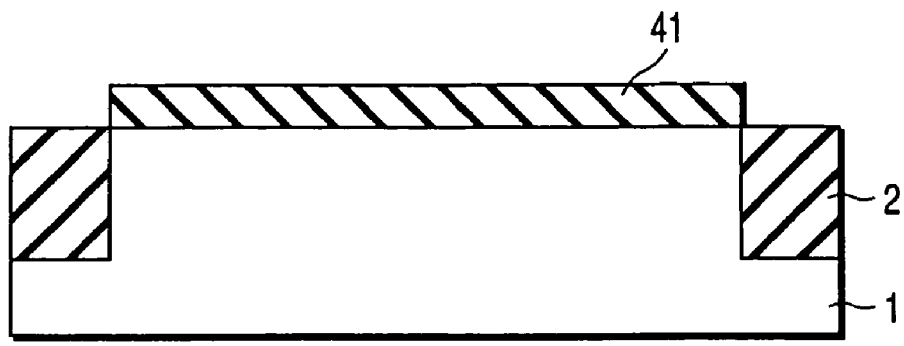
FIGS. 8A to 8C are sectional views showing the method of manufacturing a MISFET according to the third embodiment.
Figure 8B:
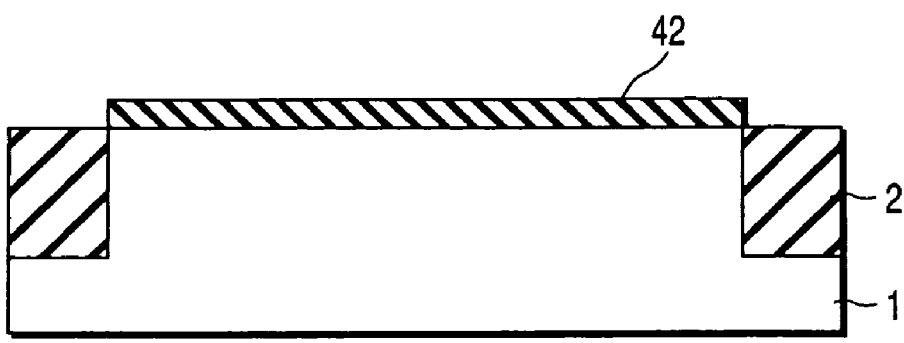
Figure 8C:
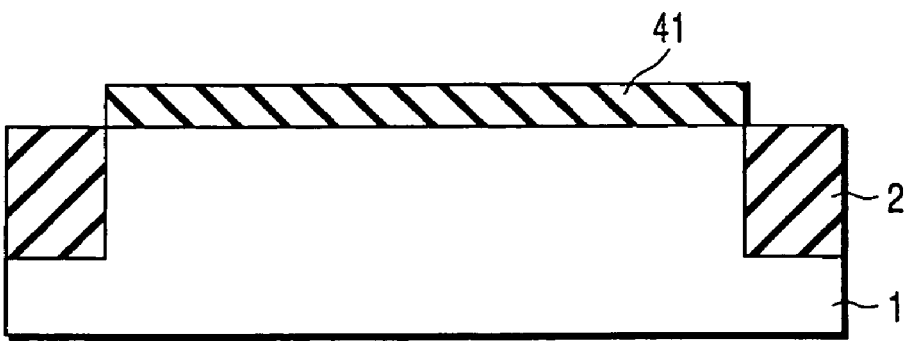

As shown in FIGS. 7A to 7C, a thick gate oxide film 41 having the thickness of about 6 nm, which is used for the DRAM and the like, is formed on the silicon substrates 1 of the DRAM, the peripheral circuit, and the high-speed logic circuit. Then, in order to form the gate oxide having the thickness of about 3 nm, which is used for the peripheral circuit and the like, the thick gate oxide film 41 of the peripheral circuit is selectively removed by lithography technology and the wet etching technology. As shown in FIGS. 8A to 8C, after removing a resist, a gate oxide film 42 having the thickness of about 3 nm is formed on the silicon substrate 1 of the peripheral circuit.

In the prior art, though the extremely thin gate insulating film is further formed as the high-speed logic circuit, the extremely thin gate insulating film made of the high dielectric material is not formed in the embodiment. Further, since hydrofluoric acid treatment which forms a pinhole in the gate oxide films 41 and 42 is not carried out, the problem of reduction of reliability is not generated in the gate oxide films of the MISFET of the DRAM and the peripheral circuit.

Figure 9A:
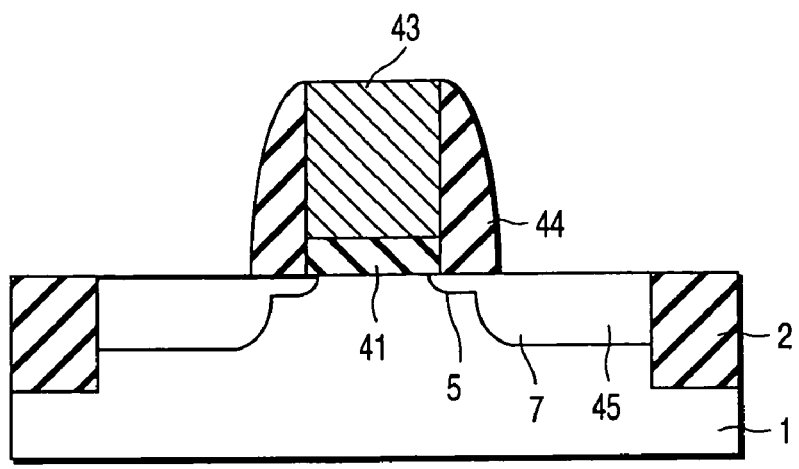
FIGS. 9A to 9C are sectional views showing the method of manufacturing a MISFET according to the third embodiment.
Figure 9B:
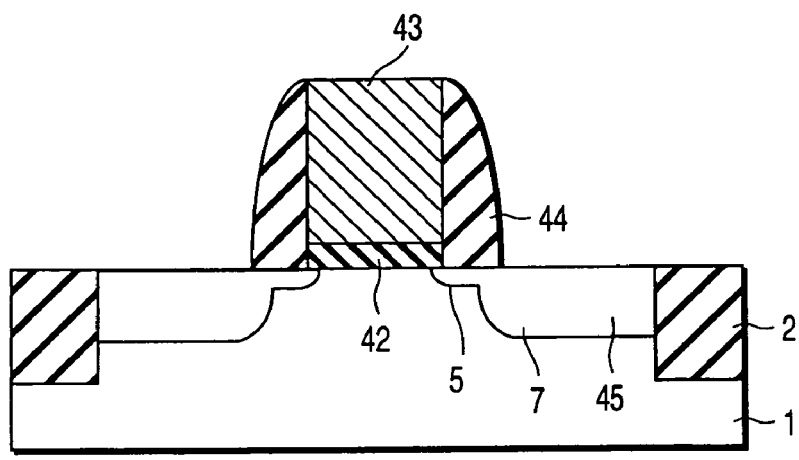
Figure 9C:
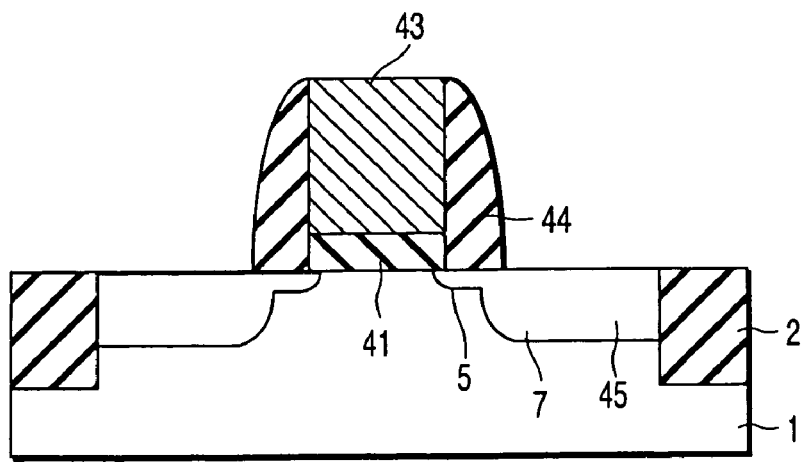

As shown in FIGS. 9A to 9C, the polysilicon film having the thickness of about 100 nm is deposited and processed to form a gate electrode 43. Using a gate sidewall 44, while a source/drain region 45 is formed, doping of the impurity is carried out into the gate electrode 43 by the ion implantation technology and the heat treatment technology. The heat treatment at this point is different from the prior art in which high-concentration activation is required, and the high temperature is not required. Since the temperature may be to an extent in which the crystalline characteristics of the silicon substrate damaged by the ion implantation are recovered, it is no problem when the temperature is about 600° C. or more. That the high temperature is not required is because FLA (Flash Lamp Anneal) technology described in Jpn. Pat. Appln. KOKAI No. 2002-151428 which uses a Xe flash lamp or the heat treatment at high temperature for short time which adopts lamp anneal technology is carried out in the later step.

Figure 10A:
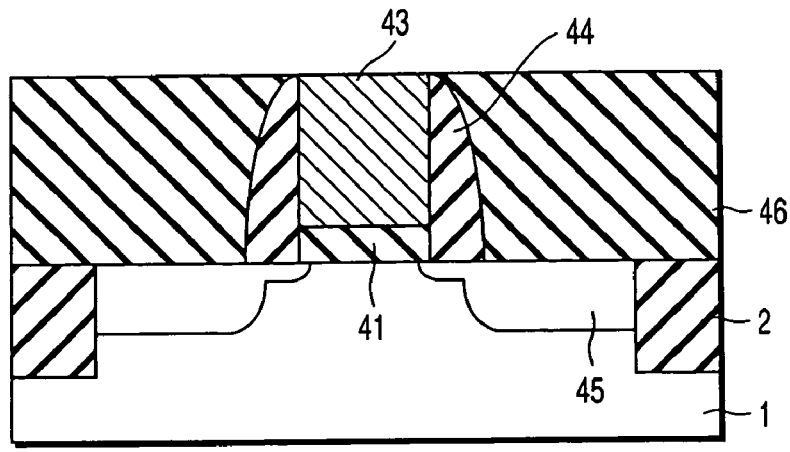
FIGS. 10A to 10C are sectional views showing the method of manufacturing a MISFET according to the third embodiment.
Figure 10B:
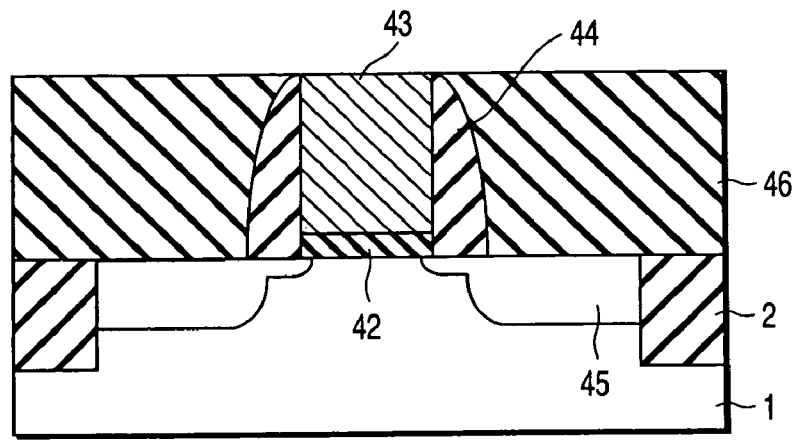
Figure 10C:
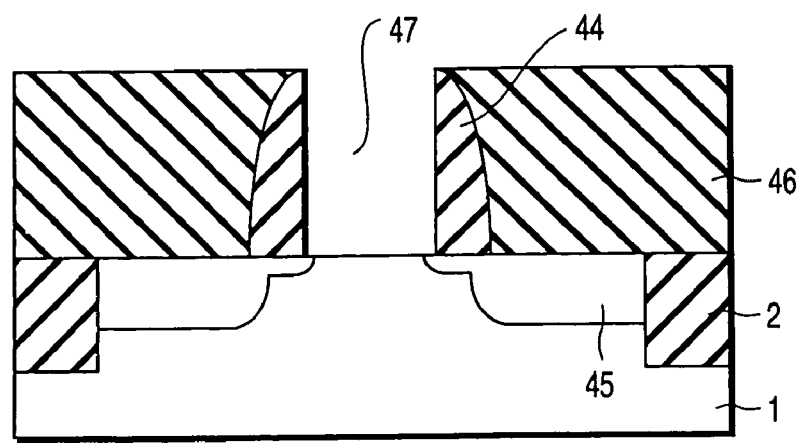

As shown in FIGS. 10A to 10C, the planarization is carried out by depositing an interlayer film 46. Then, the gate electrode 43 is selectively removed only in the high-speed logic circuit, only the gate region of the high-speed logic circuit is opened, and a groove 47 is formed.

Figure 11A:
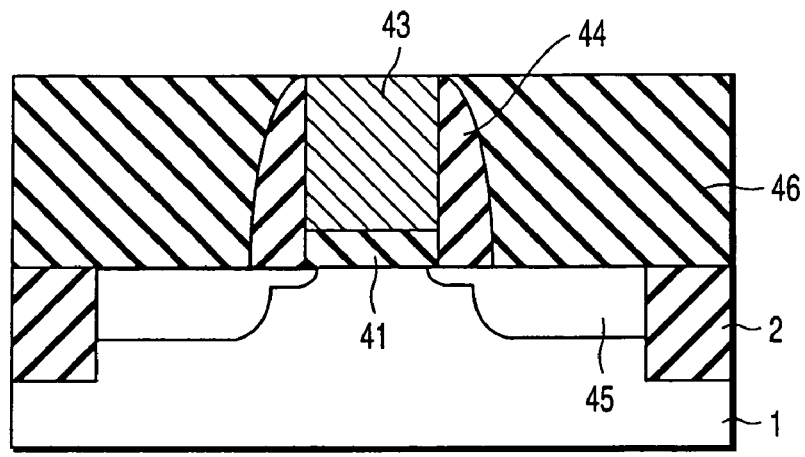
FIGS. 11A to 11C are sectional views showing the method of manufacturing a MISFET according to the third embodiment.
Figure 11B:
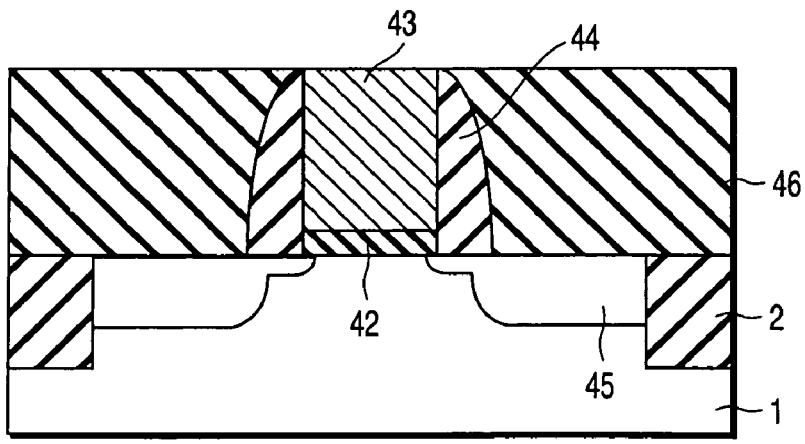
Figure 11C:
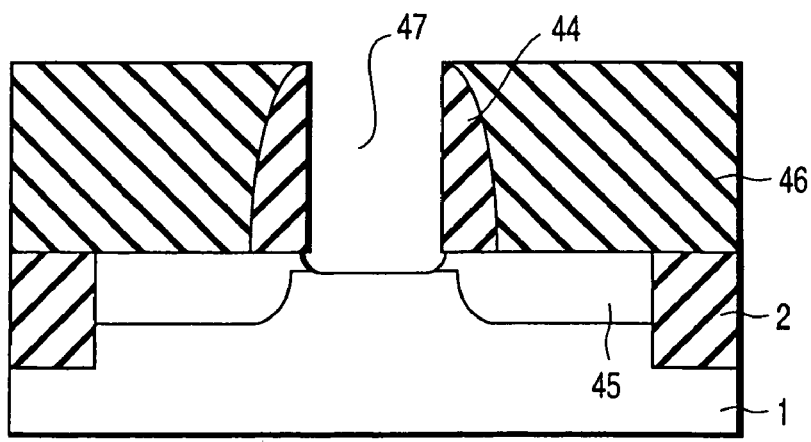

The channel region of the bottom surface of the groove 47, which has emerged by the opening, is oxidized to an extent of 10 nm and this oxide film is etched with hydrofluoric acid. As shown in FIGS. 11A to 11C, this treatment results in formation of a recessed channel 48 having the depth of about 5 nm. At this point, the oxidation carried out as low as not more than 500° C. by adopting the plasma oxidation. Accordingly, unlike the method carrying out the thermal oxidation at a temperature of about 800° C., there in no problem that the impurity in the source/drain region is diffused by heat during the oxidation and the diffusion layer is deepened.

Figure 12A:
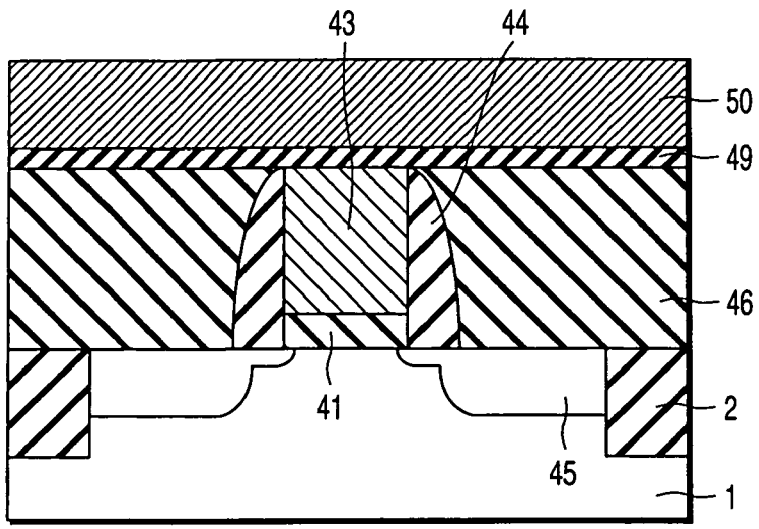
FIGS. 12A to 12C are sectional views showing the method of manufacturing a MISFET according to the third embodiment.
Figure 12B:
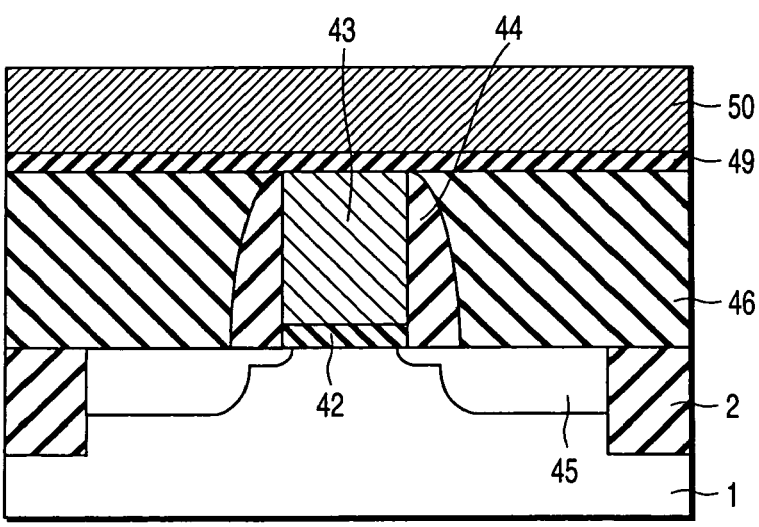
Figure 12C:
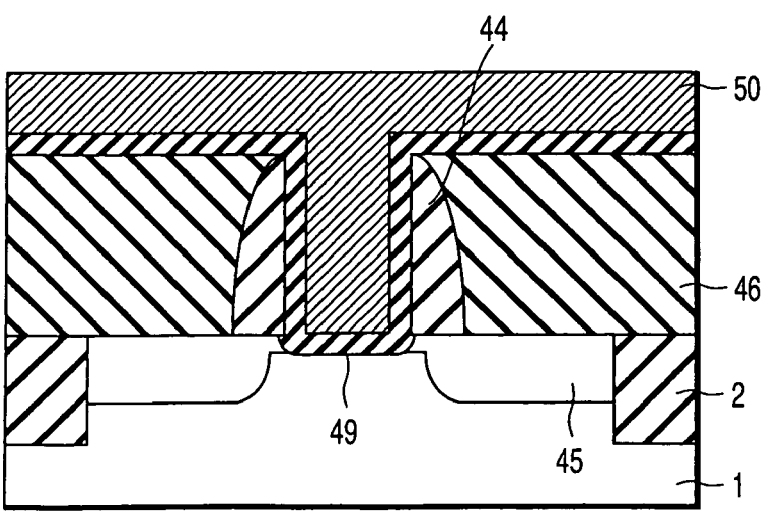

After a natural silicon oxide film having the thickness of about 1 nm (not shown) on the surface of the recessed channel 48 is removed by the hydrofluoric acid treatment, as shown in FIGS. 12A to 12C, a high dielectric gate insulating film 49 and a gate electrode material 50, of the high-speed logic circuit, made of polysilicon or polysilicon-germanium are deposited over the surface.

Unlike the prior art, the hydrofluoric acid treatment can be carried out before depositing the high dielectric gate insulating film 49. This is because the thick gate oxide 41 of the DRAM and the gate oxide 42 having the thickness of about 3 nm of the peripheral circuit are not exposed at the time when hydrofluoric acid treatment is carried out.

The ion implantation of the optimum impurity is carried out into at least the gate electrode regions of the n-type MOSFET and the p-type MOSFET of the high-speed logic circuit, respectively. Usually arsenic or phosphorus is the optimum impurity for the n-type MOSFET and boron is the optimum impurity for the p-type MOSFET.

Then, the FLA treatment or the lamp anneal treatment is carried out. Unlike the prior art, since the whole surface of the wafer is completely covered with the gate electrode material 50 of the high-speed logic circuit, there is no problem that different surface states exist like the prior art and the element is destroyed. Before the FLA treatment or the lamp anneal treatment, an extent of an amorphous state in the gate electrode material 50 of the high-speed logic circuit may be increased by ion-implanting germanium or the like. This is because the activation at a higher temperature can be realized in such a manner that an absorption index of light is increased in irradiation of the FLA treatment or the lamp anneal treatment by increasing the extent of the amorphous state.

Figure 13A:
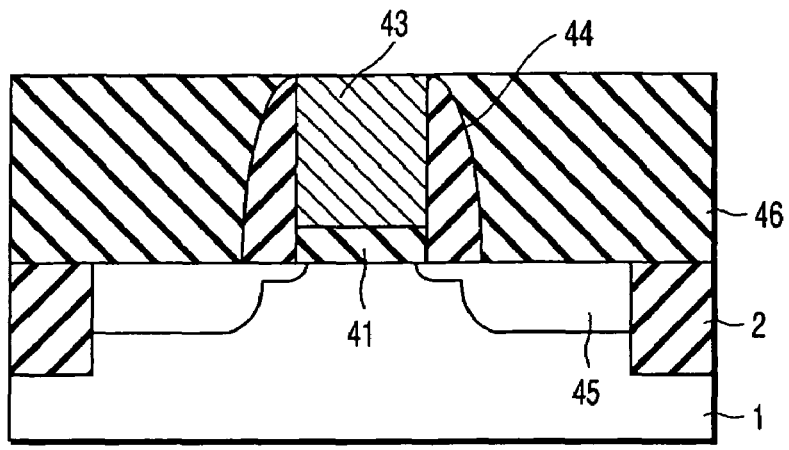
FIGS. 13A to 13C are sectional views showing the method of manufacturing a MISFET according to the third embodiment.
Figure 13B:
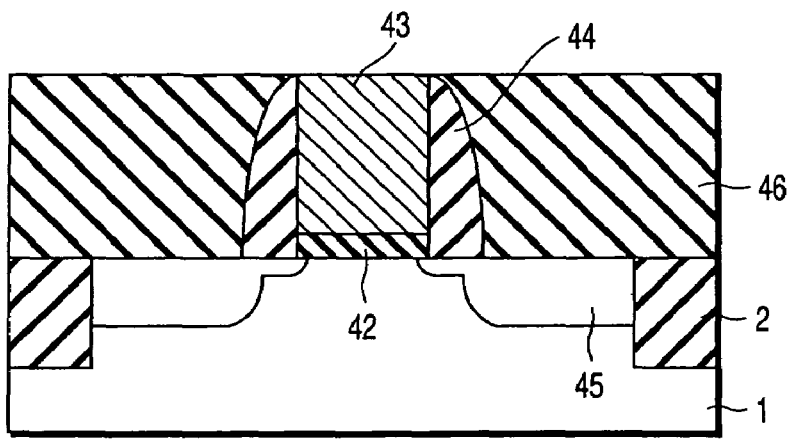
Figure 13C:
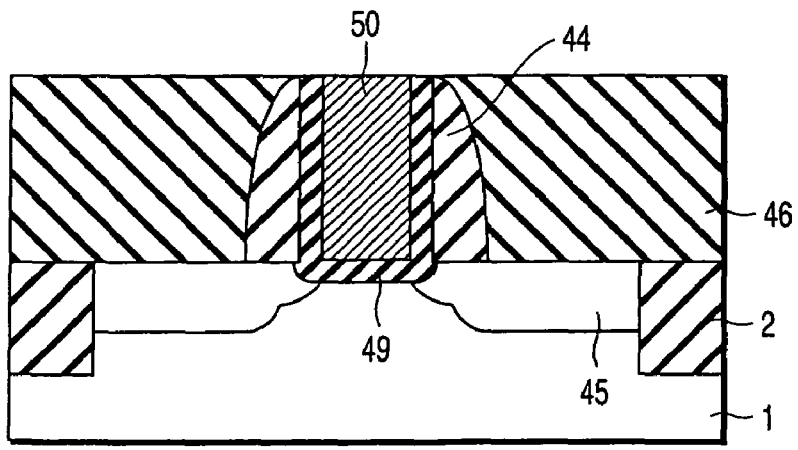
Figure 15A:
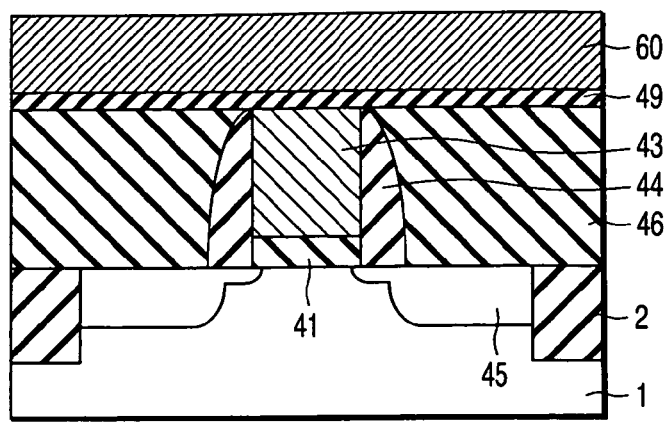
FIGS. 15A to 15D are sectional views showing a method of manufacturing a MISFET according to a fourth embodiment of the invention.
Figure 15B:
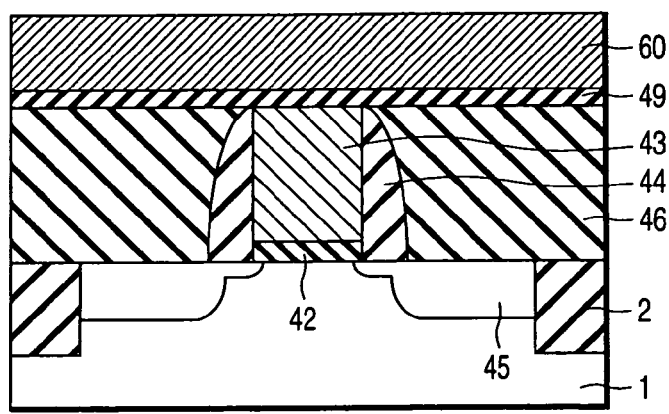
Figure 15C:
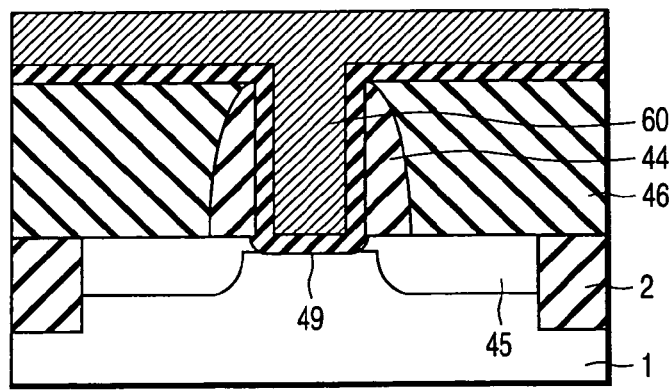
Figure 15D:
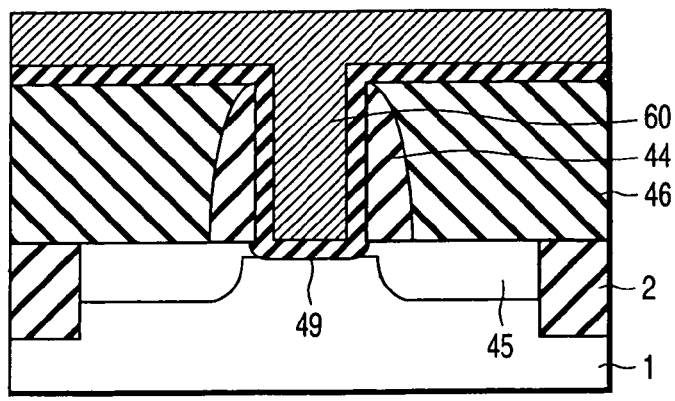

As shown in FIGS. 13A to 13C, the planarization of the gate electrode material 50 is carried out to form the gate electrode 50 of the high-speed logic circuit. The gate electrode material is polysilicon in the embodiment. Since the gate electrode 50 is polysilicon, the impurity such as arsenic (As), phosphorus (P), or boron (B) is introduced into the gate electrode 50 by the ion implantation. Then, activation heat treatment is carried out at a temperature not lower than 1000° C. in order to activate the impurity doped into the gate electrode 50. The extension region is also deepened by the heat treatment and an extension region having the deeper diffusion depth is formed.

As shown in FIGS. 14A to 14C, the interlayer films 46 of the peripheral circuit (FIG. 14B) and the high-speed logic circuit (FIG. 14C) are removed and the surface of the source/drain diffusion layer 45 is exposed. For example, Ni silicide 51 is formed by adopting silicide technology on the source/drain regions 45 of the peripheral circuit and the high-speed logic circuit, the top surfaces of the gate electrode 43 of the peripheral circuit and the gate electrode 50 of the high-speed logic circuit, and top surface of the gate electrode 43 of DRAM (FIG. 14A). Then, wiring to the source/drain region 45 and the gate electrode 43 is carried out to complete the transistor.

In the embodiment, on fear that the capacitor of the DRAM is contaminated by metal, the Ni silicide 51 has not been formed in the source/drain region 45 of the DRAM. According to demand such as high-speed DRAM, for example the interlayer film 46 only on the drain side, which is not connected to the trench capacitor, is removed and the Ni silicide 51 may be formed only on the drain side.

An the LSI circuit, in which the high dielectric gate insulating film 49 and the recessed channel are provided in only the high-speed logic circuit, and the high-speed logic circuit and DRAM are combined on a single chip, can be formed in the above-described-way. In the high-speed logic circuit, the recessed channel is provided and the activation heat treatment of the impurity is carried out by the flash lamp anneal treatment at the higher temperature for short-time or the lamp anneal treatment at the higher temperature for short time, so that the source/drain diffusion region is extremely shallow and the source/drain diffusion region having the low resistance is realized. Further, the gate electrode activated to the high concentration is provided, so that the transistor having the high driving force can be formed.

The hydrofluoric acid treatment is carried out immediately before depositing the high dielectric gate insulating film 49 of the high-speed logic-circuit, and an interfacial layer of the silicon oxide film having the thickness not lower than 1 nm does not exist between the high dielectric gate insulating film 49 and the channel unlike the prior art, so that an electric reduced thickness of the silicon oxide film not more than 1 nm can be realized.

Fourth Embodiment

In the first embodiment, though the gate electrode 50 made of polysilicon or polysilicon-germanium is buried in the high-speed logic circuit, a merit is obtained even if a metal gate is used as the electrode. It will be described in the order of the process.

A fourth embodiment of the invention will be described referring to FIGS. 15A to 20A, FIGS. 15B to 20B, FIGS. 15C to 20C, and FIG. 15D to 20D. FIGS. 15A to 20A, FIGS. 15B to 20B, FIGS. 15C to 20C, and FIGS. 15D to 20D are sectional views showing a method of manufacturing a MISFET according to the fourth embodiment of the invention. In FIGS. 15A to 20A, FIGS. 15B to 20B, FIGS. 15C to 20C, and FIGS. 15D to 20D, FIG. mA shows a DRAM, FIG. mB shows a peripheral circuit, FIG. mC shows an n-type MOSFET of a high-speed logic circuit, and FIG. mD shows a p-type MOSFET of a high-speed logic circuit (m=15 to 20).

The same steps described in the third embodiment using FIGS. 6A to 10A, FIGS. 6B to 10B, and FIGS. 6C to 10C are carried out. Then, activation heat treatment is carried out at a temperature not lower than 1000° C. in order to activate the impurity doped into the gate electrode 43. The extension region is also deepened by the heat treatment and an extension region having the deeper diffusion depth is formed. As shown in FIGS. 15A to 15D, after the high dielectric gate insulating film 49 is deposited, for example a tungsten silicide film 60 is formed. The tungsten silicide-film 60 has work function not more than 4.6 eV, and it is suitable for the gate electrode of the n-type MOSFET. The work function can be changed by adjusting a content of silicon in the tungsten silicide film 60. Further, the work function can be changed in such a manner that the tungsten silicide film 60 contains phosphorus, arsenic, antimony, tellurium, selenium, germanium, gallium, indium, or boron. According to the work function required for LSI, the work function can be controlled by the above-described technology.

Figure 16A:
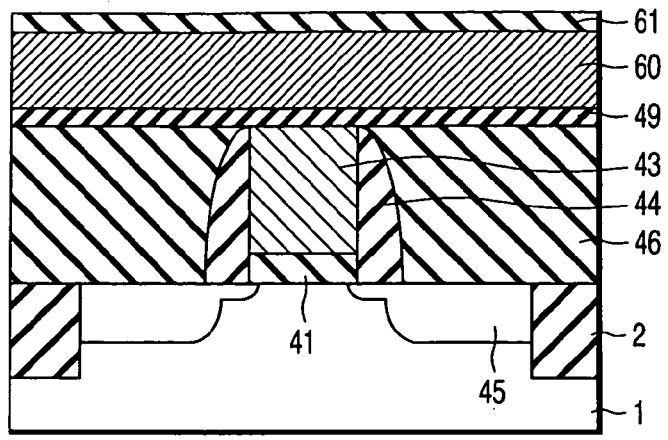
FIGS. 16A to 16D are sectional views showing the method of manufacturing a MISFET according to the fourth embodiment.
Figure 16B:
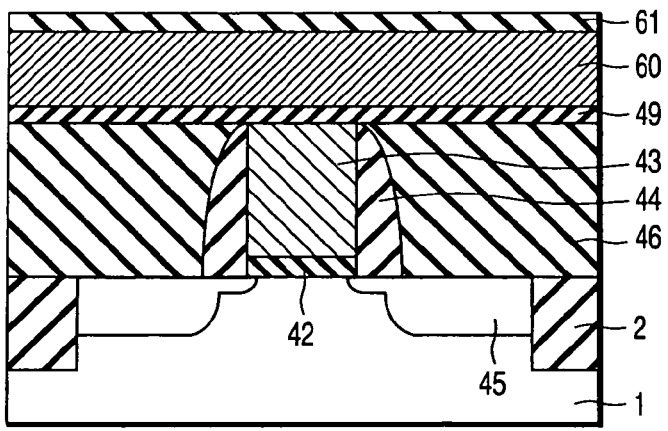
Figure 16C:
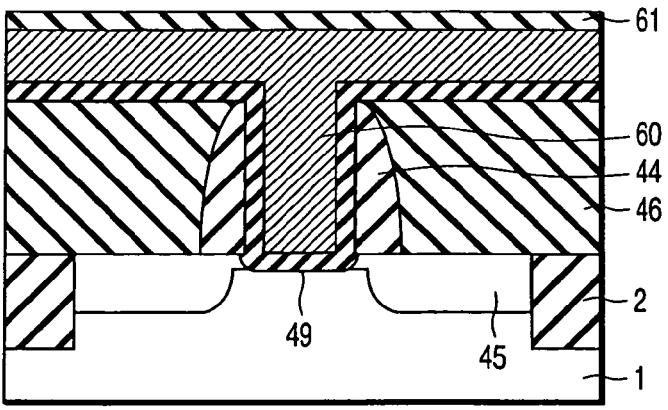
Figure 16D:
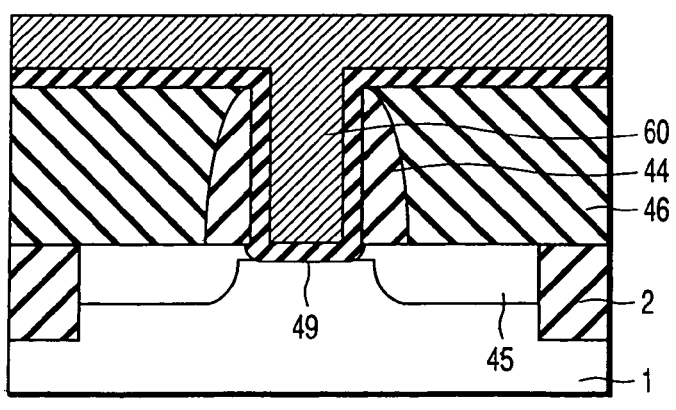
Figure 17A:
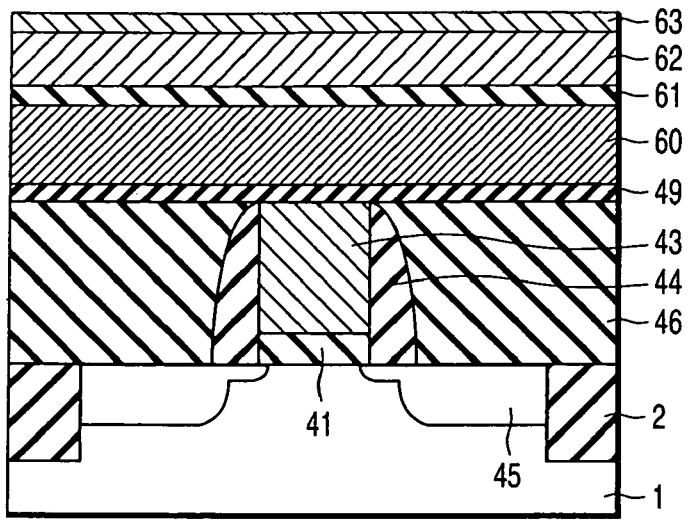
FIGS. 17A to 17D are sectional views showing the method of manufacturing a MISFET according to the fourth embodiment.
Figure 17B:
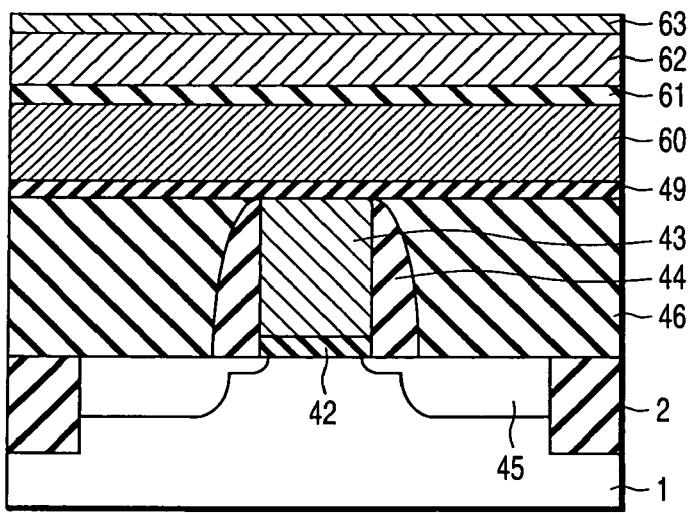
Figure 17C:
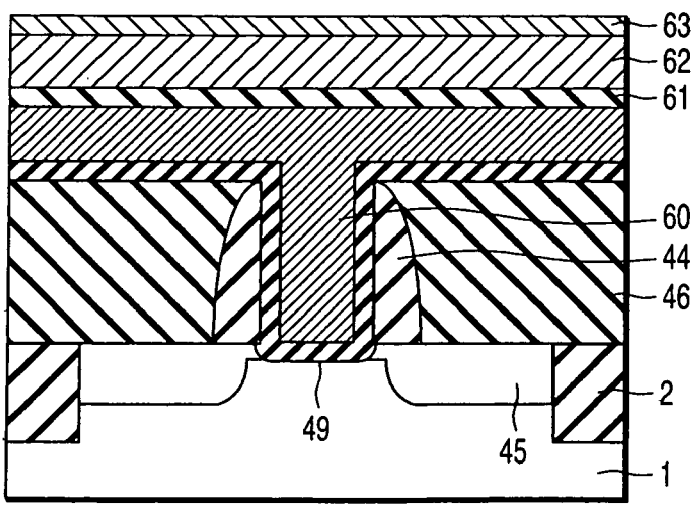
Figure 17D:
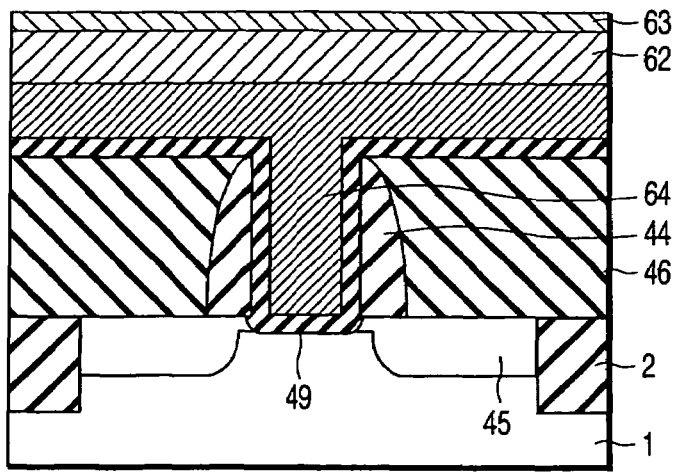
Figure 18A:
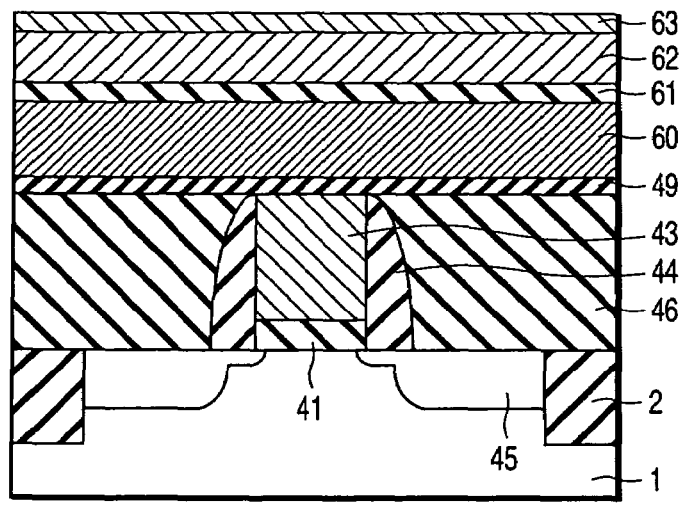
FIGS. 18A to 18D are sectional views showing the method of manufacturing a MISFET according to the fourth embodiment.
Figure 18B:
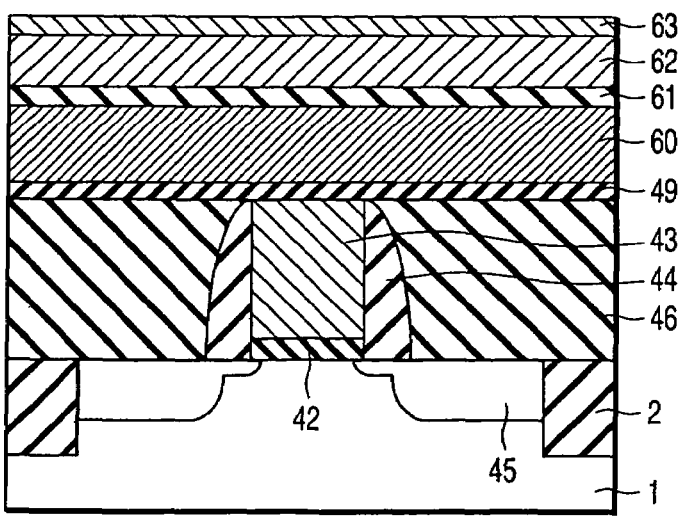
Figure 18C:
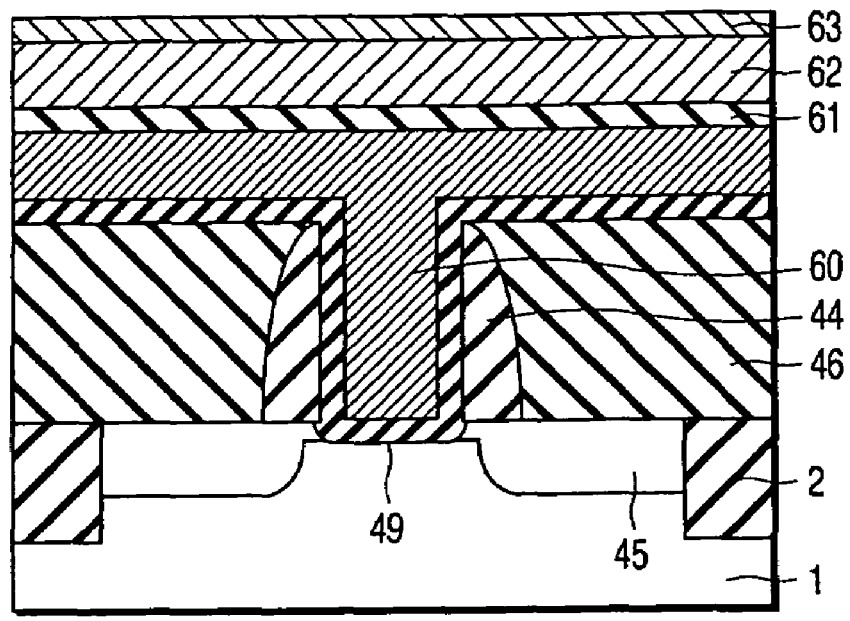
Figure 18D:
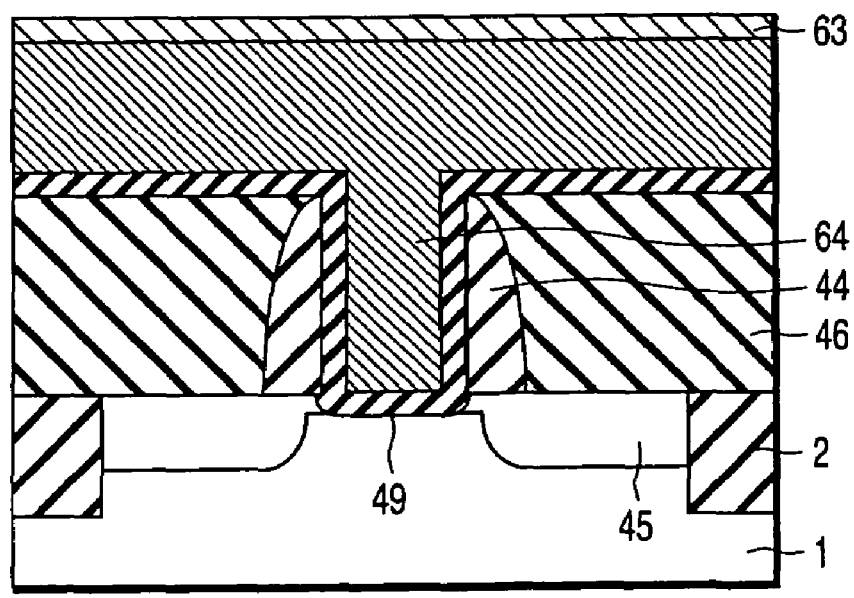

As shown in FIGS. 16A to 16D, a silicon nitride film 61 having the thickness of about 10 nm, which becomes a barrier film later, is deposited. The silicon nitride film 61 of the p-type MOSFET of the high-speed logic circuit is selectively removed (FIG. 16D). As shown in FIGS. 17A to 17D, a Pt film 62 having the thickness of about 50 nm and a TiN film 63 having the thickness of about 10 nm are formed.

Then, the heat treatment is carried out at a temperature not more than 500° C. As shown in FIGS. 18A to 18D, in the heat treatment only the tungsten silicide film 60 of the p-type MOSFET of the high-speed logic circuit is reacted with the Pt film 62 and a metal gate electrode 64 is formed. The metal gate electrode 64 is PtSi, W, or a mixture of them. Since the work function of the metal gate electrode 64 is not lower than 4.6 eV, the gate electrode of the p-type MOSFET of the high-speed logic circuit becomes the electrode of the work function suitable for the p-type MOSFET.

Figure 19A:
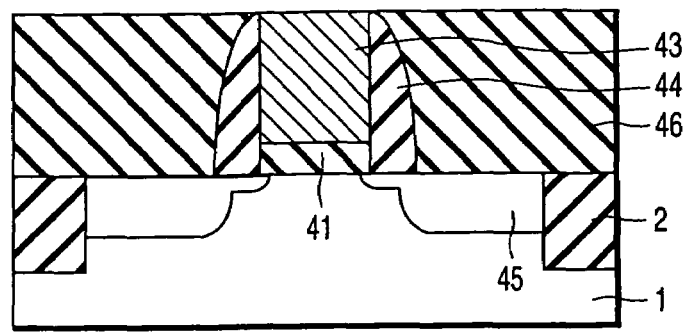
FIGS. 19A to 19D are sectional views showing the method of manufacturing a MISFET according to the fourth embodiment.
Figure 19B:
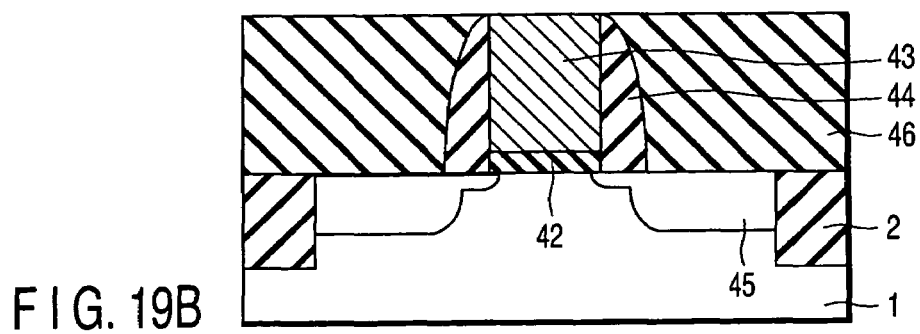
Figure 19C:
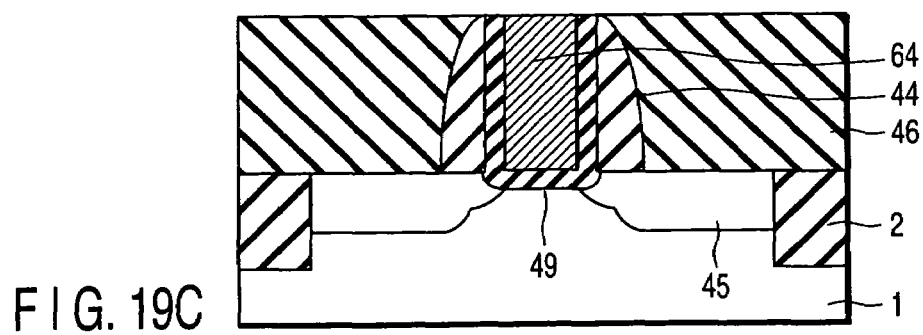
Figure 19D:
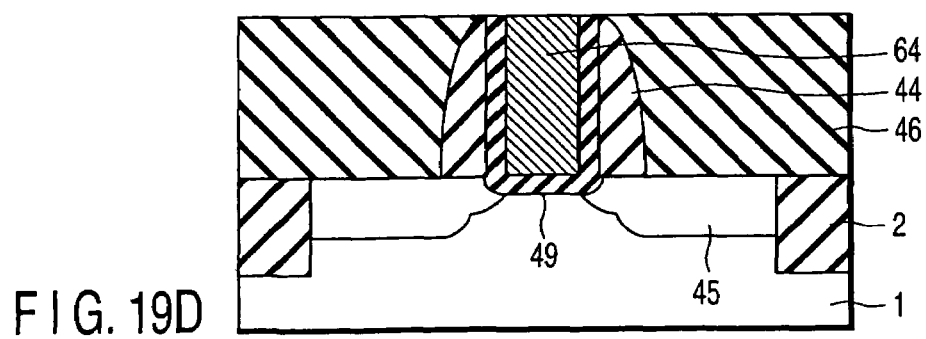

As shown in FIGS. 19A to 19D, the planarization is carried out until the interlayer film 46 is exposed, the tungsten silicide film 60 is formed in the n-type MOSFET of the high-speed logic circuit (FIG. 19C), and the metal gate electrode 64 is formed in the p-type MOSFET of the high-speed logic circuit (FIG. 19D).

Figure 20A:
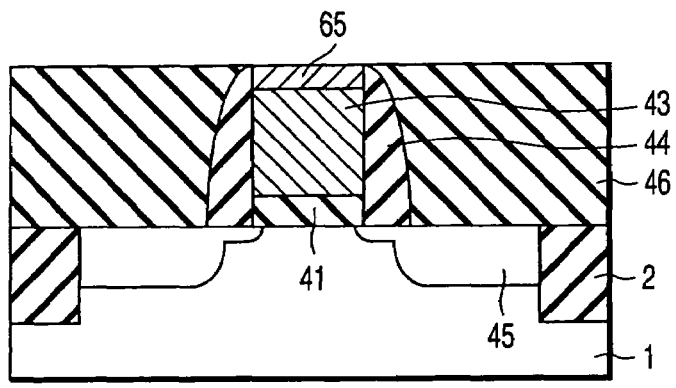
FIGS. 20A to 20D are sectional views showing the method of manufacturing a MISFET according to the fourth embodiment.
Figure 20B:
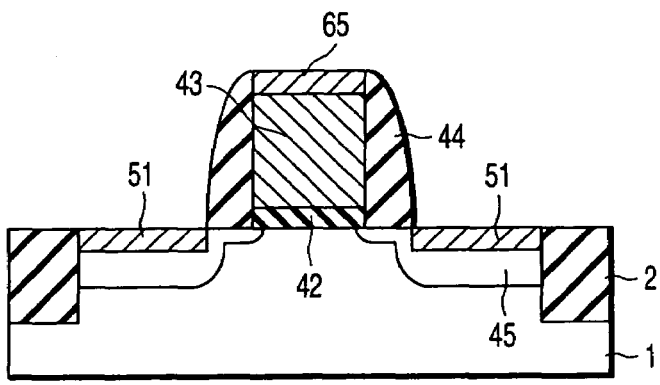
Figure 20C:
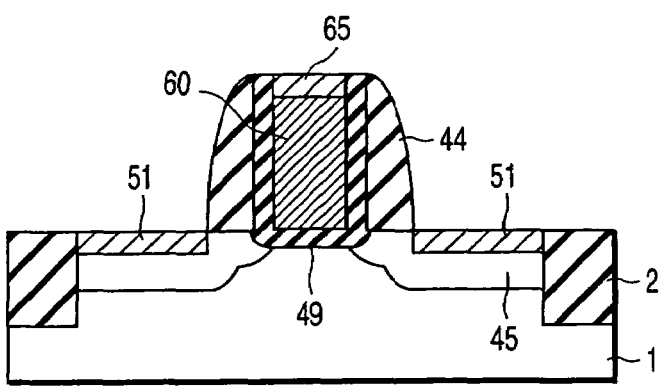
Figure 20D:
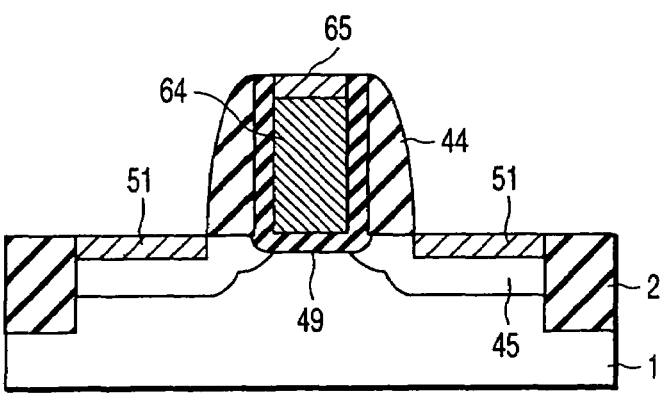
Figure 21A:
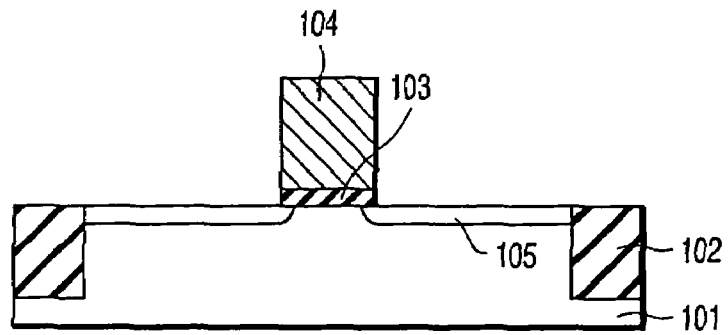
FIGS. 21A to 21D are sectional views of a process showing a method of manufacturing a conventional semiconductor device.
Figure 21B:
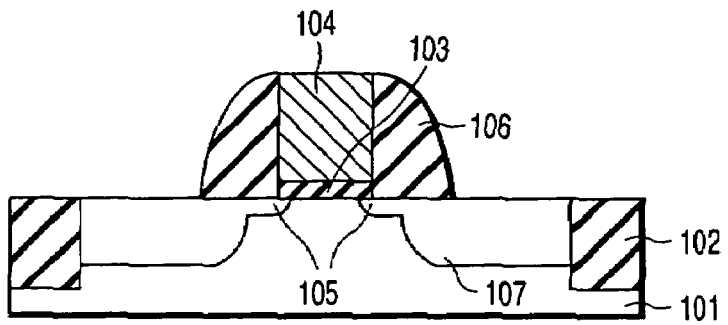
Figure 21C:
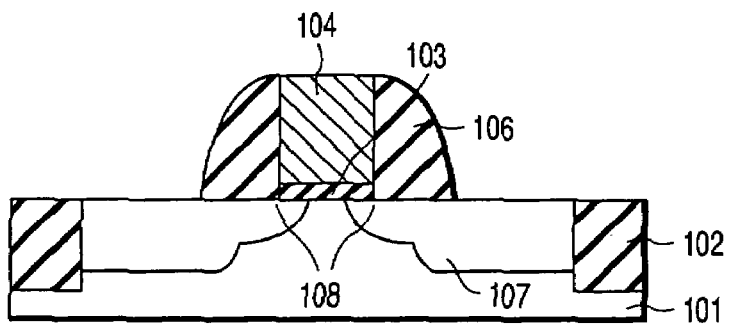
Figure 21D:
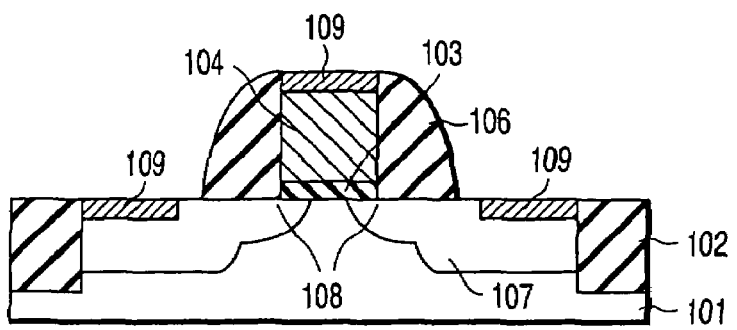
Figure 22:
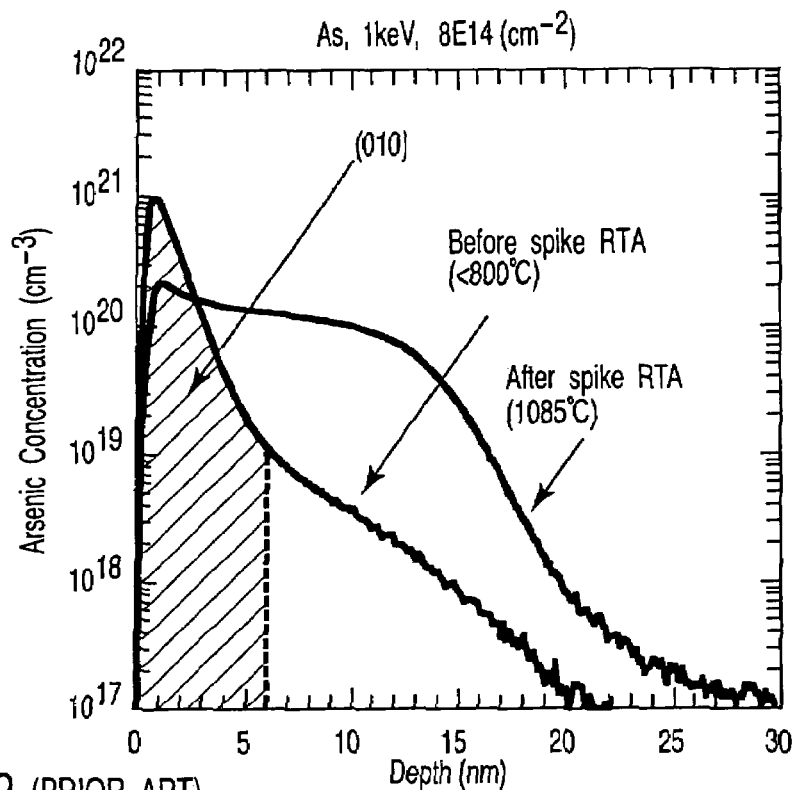
FIG. 22 is a plot of an inside of the semiconductor substrate, for explaining a problem of the method of manufacturing the conventional semiconductor device.
Figure 23:
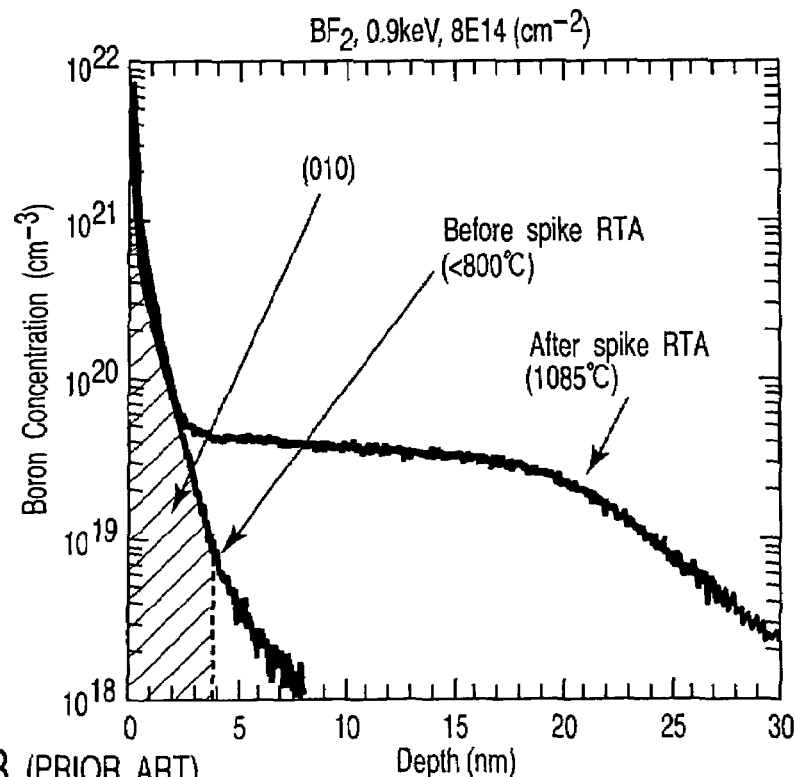
FIG. 23 is a plot of the inside of the semiconductor substrate, for explaining the problem of the method of manufacturing the conventional semiconductor device.
Figure 24A:
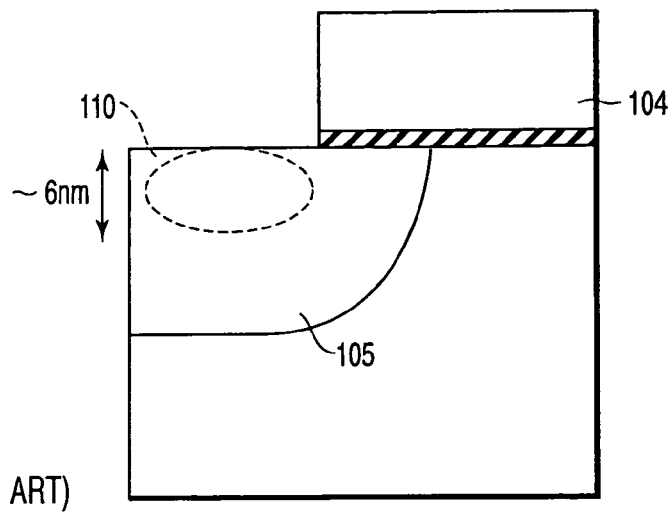
FIGS. 24A and 24B are partially sectional views of the semiconductor substrate, for explaining the problem of the method of manufacturing the conventional semiconductor device.
Figure 24B:
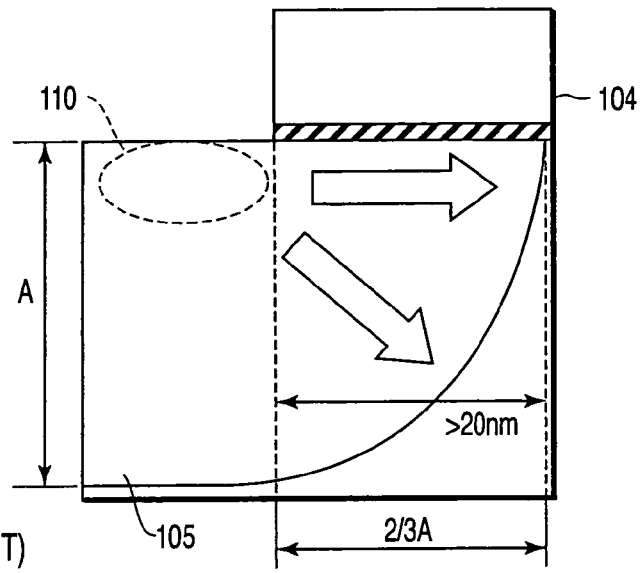

As shown in FIGS. 20A to 20D, the interlayer films 46 of the peripheral circuit (FIG. 20B) and the high-speed logic circuit (FIGS. 20C and 20D) are removed, and the surface of the source/drain diffusion layer 45 is exposed. By using the silicide technology, for example Ni silicides 65 are formed in the source/drain regions 45 of the peripheral circuit (FIG. 20B) and the high-speed logic circuit (FIGS. 20C and 20D), and on the top surfaces of the gate electrodes 43, 60, and 64, of the peripheral circuit, the high-speed logic circuit, and DRAM (FIG. 20A). Then, the wiring to the source, the drain, and the gate is carried out to complete the transistor.

In the embodiment, on fear that the capacitor of the DRAM is contaminated by metal, the Ni silicide 51 has not been formed in the source/drain region 45 of the DRAM. According to demand such as high-speed DRAM, for example the interlayer film 46 only on the drain side, which is not connected to the trench capacitor, is removed and the Ni silicide 51 may be formed only on the drain side.

In the above-described way, the transistor in which only the high-speed logic circuit has the high dielectric gate insulating film 49 and the metal gate electrodes 60 and 64, and the work function of the metal gate 60 of the n-type MOSFET is not more than 4.6 eV and the work function of the metal gate 64 of the p-type MOSFET is not more than 4.6 eV, has been able to be formed. Further, since the high dielectric gate insulating film 49 and metal gate electrode do not exist in the DRAM, the problem of metal contamination of the DRAM has been able to be avoided.

In each embodiment, adopting the ion implantation technology and the activation technology which are similar to the conventional technology, the transistor in which the miniaturization further proceeds and higher performance is achieved can be formed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:
    forming a dummy gate insulating film on a semiconductor substrate, and forming a dummy gate electrode on the dummy gate insulating film;
    carrying out ion implantation of an impurity into a surface region of the semiconductor substrate by using the dummy gate insulating film and the dummy gate electrode as a mask, and forming an extension region;
    forming a gate sidewall insulating film on side faces of the dummy gate insulating film and the dummy gate electrode;
    doping the impurity into a surface region of the semiconductor substrate by using the dummy gate insulating film, the dummy gate electrode and the gate sidewall insulating film as a mask to form a contact junction region, and forming a source region and a drain region which are constituted of the contact junction region and the extension region;
    forming an interlayer insulating film on the semiconductor substrate so as to cover the dummy gate insulating film, the dummy gate electrode, and the gate sidewall insulating film;
    polishing the interlayer insulating film until a surface of the dummy gate electrode is exposed, and planarizing the surface;
    removing selectively the dummy gate insulating film and the dummy gate electrode to form a gate opening region in the interlayer insulating film;
    forming a recess on the surface region of the semiconductor substrate by oxidizing the surface of the semiconductor substrate, which is exposed on a bottom portion of the gate opening region, with plasma oxygen at a temperature of not more than 600° C., and by removing selectively the oxidized part;
    insulating the surface of the recess in a bottom surface of the gate opening region to form a gate insulating film; and
    burying a gate electrode material in the gate opening region to form a gate electrode, the extension region extending beneath the gate electrode and being in contact with the gate insulating film.

2. The method according to claim 1, wherein a depth of the recess from a surface of the semiconductor substrate is deeper than the depth from the surface of the semiconductor substrate of an impurity concentration peak during ion implantation in the extension region.

3. The method according to claim 1, wherein the depth of the recess is not more than 6 nm.

4. The method according to claim 1, wherein the gate insulating film is formed at least by adopting plasma oxidation.

5. The method according to claim 1, wherein formation of the gate electrode comprises: burying polysilicon as the gate electrode material in the gate opening region; carrying out ion implantation of an impurity into the gate electrode material; and carrying out heat treatment at a temperature not lower than 1000° C. to activate the impurity.

6. The method according to claim 1, wherein a region where impurity concentration of the source/drain region is not lower than $1\times10^{19}/cm^3$ is not more than 10 nm from the surface of the semiconductor substrate.

7. The method according to claim 1, further comprising: burying polysilicon as the gate electrode material in the gate opening region, removing the interlayer insulating film, and forming a silicide layer on a surface of the gate electrode and the surface of the source/drain region.

8. The method according to claim 1, further comprising carrying out heat treatment to make the extension region deeper.

* * * * *